*(12)* United States Patent
Kim et al.

(10) Patent No.: US 12,243,892 B2
(45) Date of Patent: Mar. 4, 2025

(54) IMAGE SENSORS INCLUDING A PHOTODIODE

(71) Applicant: SAMSUNG ELECTRONICS CO., LTD., Suwon-si (KR)

(72) Inventors: Sanghoon Kim, Seongnam-si (KR); Jinju Jeon, Suwon-si (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 657 days.

(21) Appl. No.: 17/570,884

(22) Filed: Jan. 7, 2022

(65) Prior Publication Data

US 2022/0223636 A1 Jul. 14, 2022

(30) Foreign Application Priority Data

Jan. 12, 2021 (KR) .................. 10-2021-0004240

(51) Int. Cl.
*H01L 27/146* (2006.01)
*H04N 25/633* (2023.01)

(52) U.S. Cl.
CPC .... *H01L 27/1463* (2013.01); *H01L 27/14621* (2013.01); *H01L 27/14627* (2013.01); *H01L 27/1464* (2013.01); *H01L 27/14645* (2013.01); *H01L 27/14689* (2013.01); *H04N 25/633* (2023.01)

(58) Field of Classification Search
CPC ........... H01L 27/1463; H01L 27/14621; H01L 27/14627; H01L 27/1464; H01L 27/14645; H01L 27/14689; H01L 27/14636; H04N 25/633

See application file for complete search history.

(56) References Cited

U.S. PATENT DOCUMENTS

| 6,569,700 | B2 | 5/2003 | Yang |
| 9,508,768 | B2 | 11/2016 | Kokumai |
| 9,748,299 | B2 | 8/2017 | Ahn et al. |
| 10,644,051 | B2 | 5/2020 | Nah |
| 2019/0252425 | A1 | 8/2019 | Ogawa |
| 2020/0219928 | A1 | 7/2020 | Park et al. |
| 2021/0335861 | A1* | 10/2021 | Cheng ............... H01L 21/76224 |

FOREIGN PATENT DOCUMENTS

| CN | 110085609 | 8/2019 |
| KR | 10-2004-0059429 | 7/2004 |

* cited by examiner

*Primary Examiner* — Tony Ko
(74) *Attorney, Agent, or Firm* — F. CHAU & ASSOCIATES, LLC

(57) ABSTRACT

An image sensor including: a semiconductor substrate having a first surface and a second surface; a pixel device isolation film extending from the first surface of the semiconductor substrate into the semiconductor substrate, wherein the pixel device isolation film defines pixels in the semiconductor substrate, and includes a conductive layer; and a device isolation structure located inside a device isolation trench that extends from the first surface of the semiconductor substrate into the semiconductor substrate, wherein the device isolation structure includes a conductive liner electrically connected to the conductive layer, wherein a negative bias is applied to the conductive layer and the conductive liner.

20 Claims, 36 Drawing Sheets

A1 - A1'

A1 – A1'

A2 - A2'

A3 - A3'

A1 - A1'

A1 – A1'

IMAGE SENSORS INCLUDING A PHOTODIODE

CROSS-REFERENCE TO RELATED APPLICATION

This application claims priority under 35 U.S.C. § 119 to Korean Patent Application No. 10-2021-0004240, filed on Jan. 12, 2021, in the Korean Intellectual Property Office, the disclosure of which is incorporated by reference herein in its entirety.

TECHNICAL FIELD

The present inventive concept relates to an image sensor, and more particularly, to an image sensor including a photodiode.

DISCUSSION OF THE RELATED ART

Generally, an image sensor is a device that converts an optical image signal into an electrical signal. The image sensor typically has a plurality of pixels, and each of the plurality of pixels includes a photodiode region, in which incident light is received and converted into an electrical signal, and a pixel circuit, which outputs a pixel signal by using a charge generated in the photodiode region based on the incident light. As the integration of an image sensor increases, the size of each pixel decreases, and sizes of respective components in the pixel circuit also decrease. In addition, crosstalk or a dark current generated from a pixel adjacent to the image sensor may cause degradation in the quality of the image sensor.

SUMMARY

According to an exemplary embodiment of the present inventive concept, an image sensor including: a semiconductor substrate having a first surface and a second surface; a pixel device isolation film extending from the first surface of the semiconductor substrate into the semiconductor substrate, wherein the pixel device isolation film defines pixels in the semiconductor substrate, and includes a conductive layer; and a device isolation structure located inside a device isolation trench that extends from the first surface of the semiconductor substrate into the semiconductor substrate, wherein the device isolation structure includes a conductive liner electrically connected to the conductive layer, wherein a negative bias is applied to the conductive layer and the conductive liner.

According to an exemplary embodiment of the present inventive concept, an image sensor includes: a semiconductor substrate having a first surface and a second surface; a pixel device isolation film located inside a pixel trench that penetrates the semiconductor substrate, wherein the pixel device isolation trench includes a conductive layer; and a device isolation structure located inside a device isolation trench that extends from the first surface of the semiconductor substrate, wherein the device isolation structure defines an active region, wherein the device isolation structure includes: an insulating liner on an inner wall of the device isolation trench; a conductive liner on the insulating liner and covering the inner wall of the device isolation trench; and a buried insulating layer filling the device isolation trench and disposed on the conductive liner, wherein, in a region in which the device isolation structure and the pixel device isolation film vertically overlap each other, the conductive liner is electrically connected to the conductive layer.

According to an exemplary embodiment of the present inventive concept, an image sensor includes: a semiconductor substrate having a first surface and a second surface; a pixel device isolation film located inside a pixel trench that penetrates the semiconductor substrate, wherein the pixel device isolation film includes a conductive layer; and a device isolation structure located inside a device isolation trench that extends from the first surface of the semiconductor substrate into the semiconductor substrate, wherein the device isolation structure defines an active region, wherein the device isolation structure further includes: an insulating liner on an inner wall of the device isolation trench; a conductive liner covering the inner wall of the device isolation trench and disposed on the insulating liner; and a buried insulating layer filling the device isolation trench and disposed on the conductive liner, wherein a negative bias is applied to the conductive liner.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
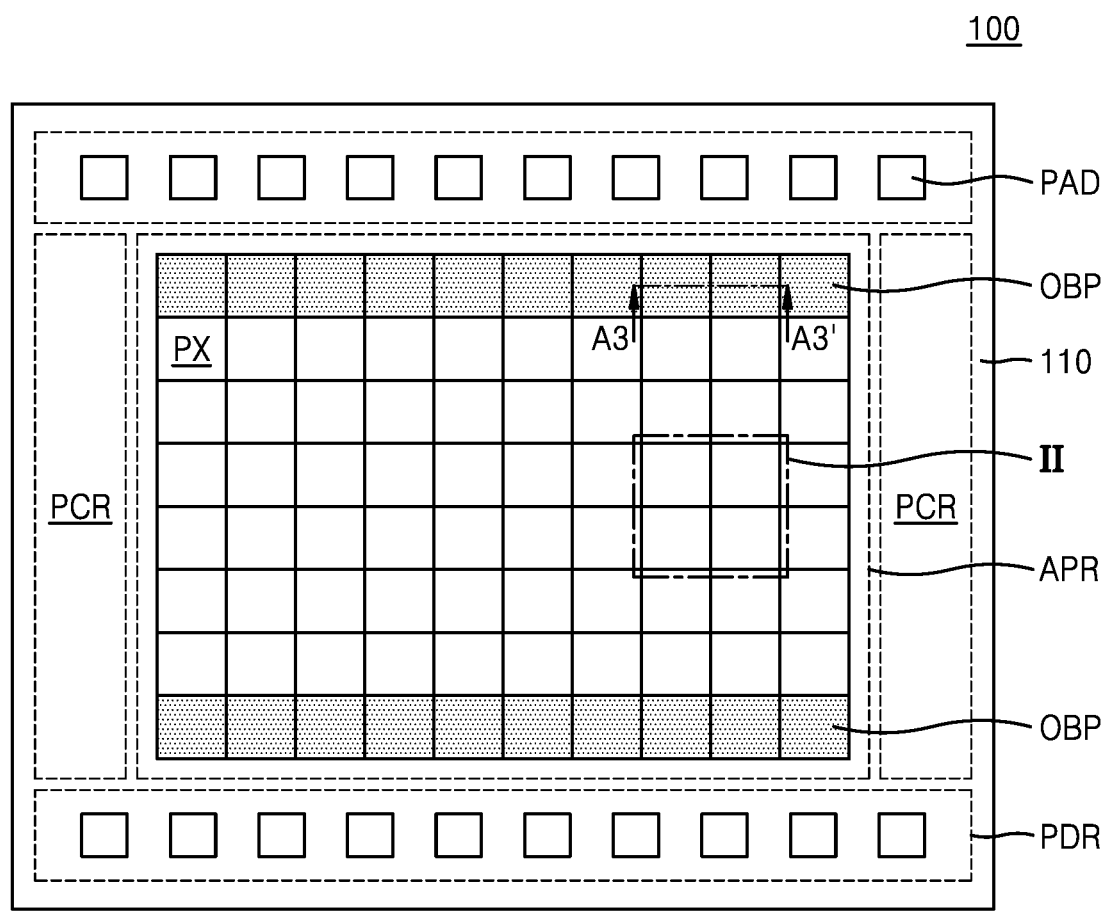
FIG. 1 is a layout diagram of an image sensor according to an exemplary embodiment of the present inventive concept.
Figure 2:
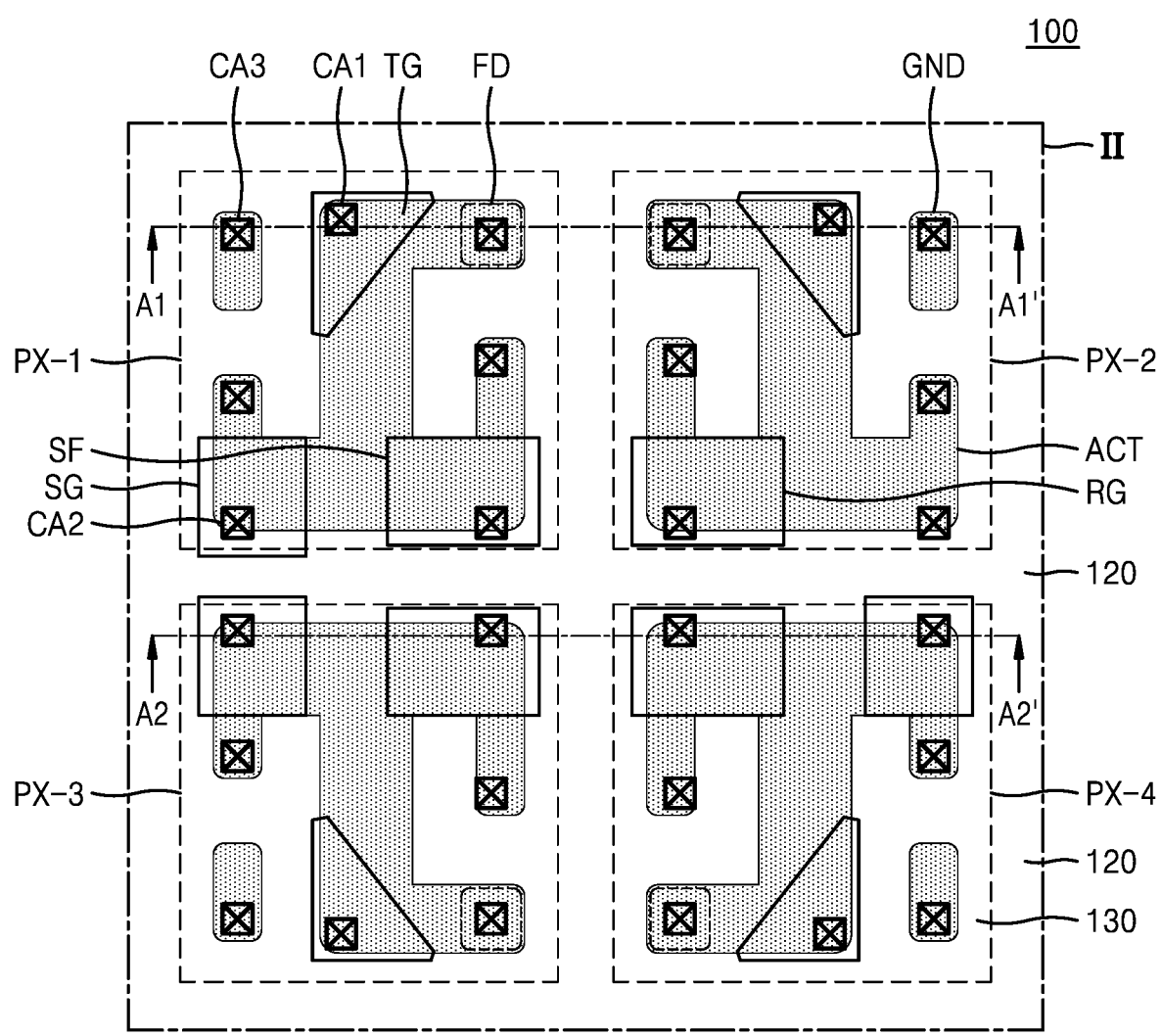
FIG. 2 is an enlarged layout diagram of portion II shown in FIG. 1.
Figure 3:
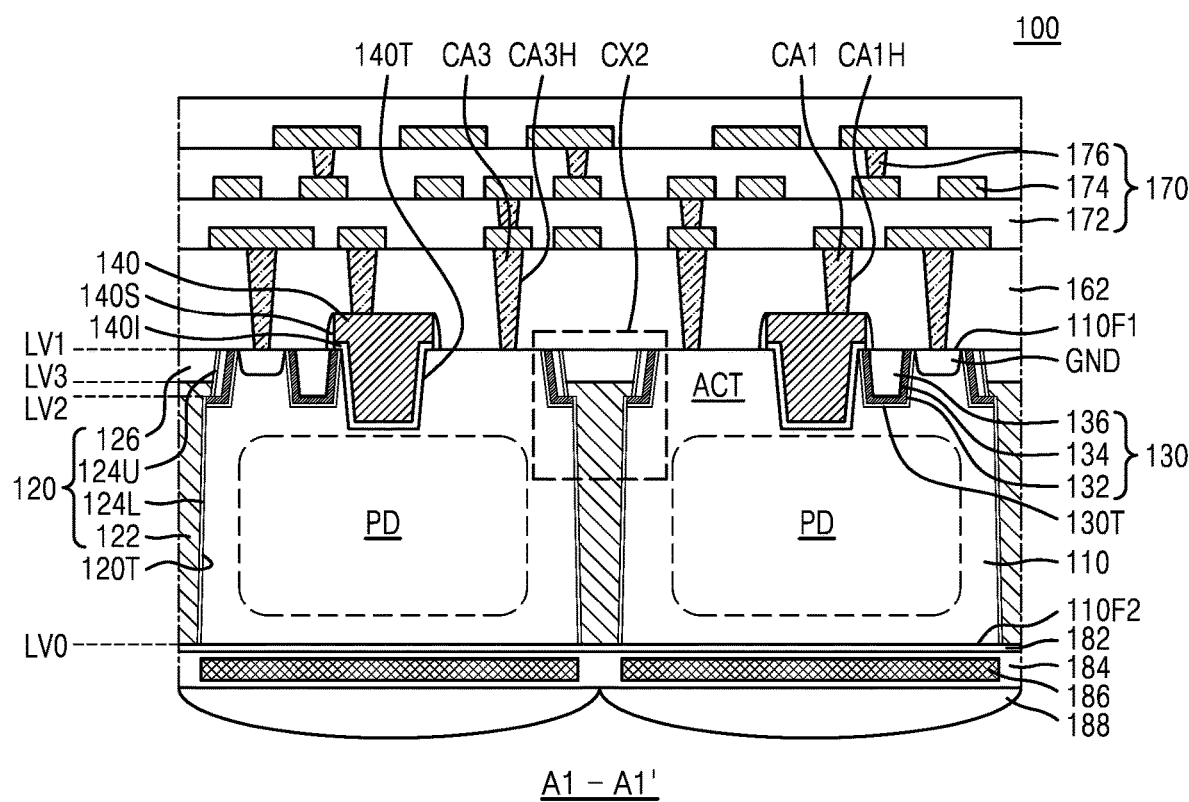
FIG. 3 is a cross-sectional view taken along line A1-A1' shown in FIG. 2.
Figure 4:
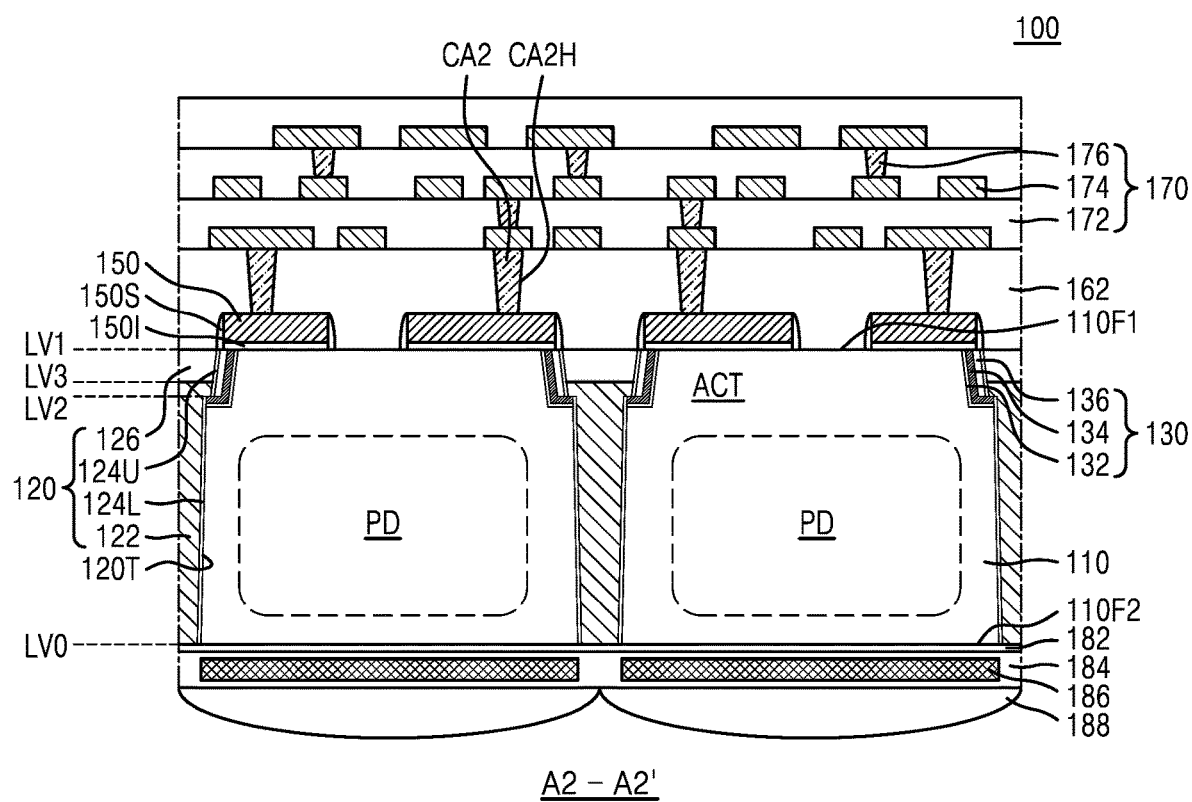
FIG. 4 is a cross-sectional view taken along line A2-A2' shown in FIG. 2.
Figure 5:
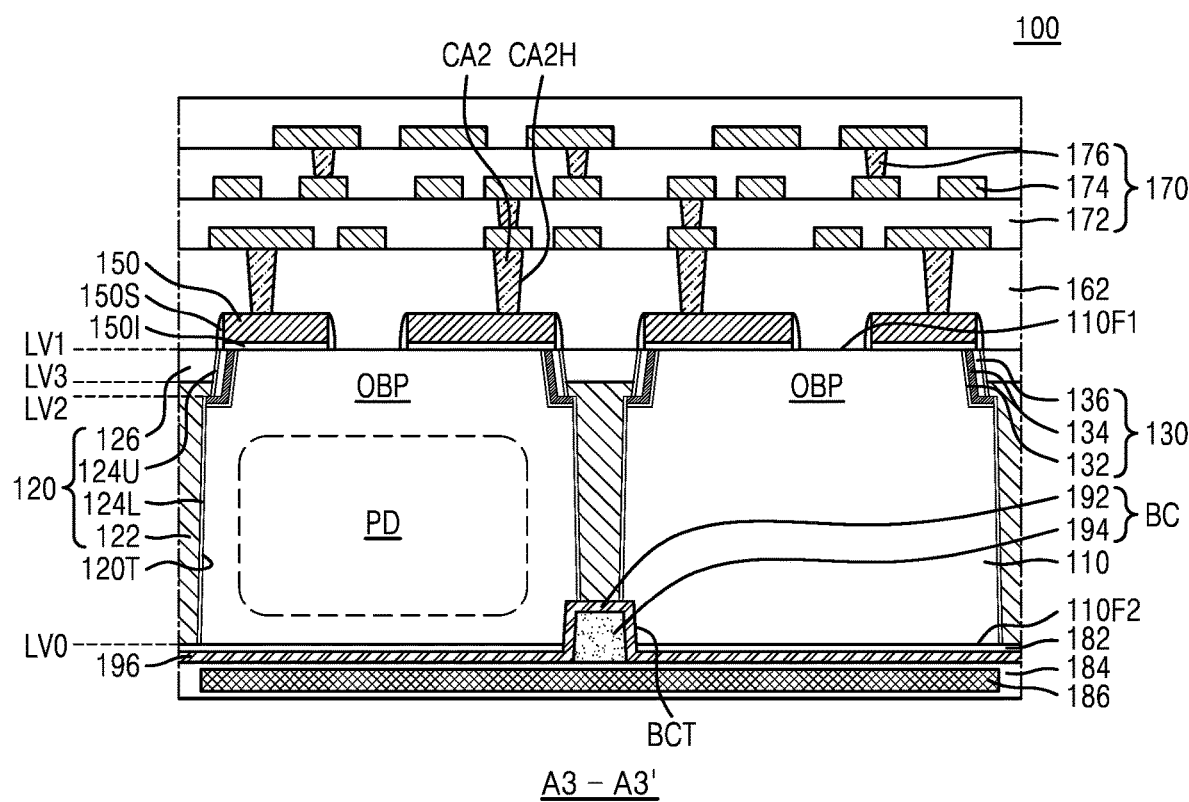
FIG. 5 is a cross-sectional view taken along line A3-A3' shown in FIG. 1.
Figure 6:
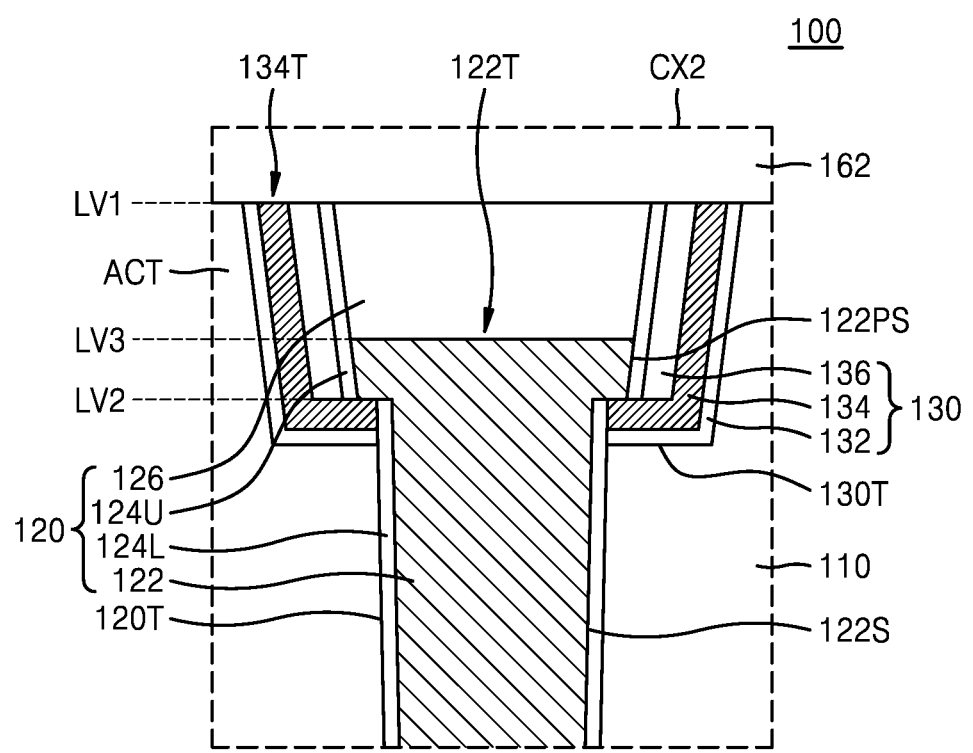
FIG. 6 is an enlarged view of portion CX2 shown in FIG. 3.

FIG. 1 is a layout diagram of an image sensor 100 according to an exemplary embodiment of the present inventive concept. FIG. 2 is an enlarged layout diagram of portion II shown in FIG. 1. FIG. 3 is a cross-sectional view taken along line A1-A1' shown in FIG. 2. FIG. 4 is a cross-sectional view taken along line A2-A2' shown in FIG. 2. FIG. 5 is a cross-sectional view taken along line A3-A3' shown in FIG. 1. FIG. 6 is an enlarged view of portion CX2 shown in FIG. 3.

Referring to FIGS. 1 through 6, the image sensor 100 may include an active pixel region APR, peripheral circuit regions PCR, and pad regions PDR formed on a semiconductor substrate 110.

The active pixel region APR may be at a center portion of the semiconductor substrate 110, and the peripheral circuit regions PCR may be at two sides of the active pixel region APR. The pad regions PDR may be at edge portions of the semiconductor substrate 110.

The active pixel region APR may include a plurality of pixels PX, and a plurality of photoelectric conversion regions PD may be respectively disposed in the plurality of pixels PX. In the active pixel region APR, the plurality of pixels PX may be arranged in the form of a matrix in rows and columns, in a first direction X, which is parallel to a top surface of the semiconductor substrate 110, and in a second direction Y, which is substantially perpendicular to the first direction and parallel to the top surface of the semiconductor substrate 110. Some of the plurality of pixels PX may include optical black pixels OBP. The optical black pixels OBP may function as reference pixels for the active pixel region APR, and may perform a function to automatically calibrate dark signals.

Although it is illustrated that the peripheral circuit regions PCR are arranged at the two sides of the active pixel region APR in a plan view, the peripheral circuit regions PCR are not limited thereto and may surround the entire active pixel region APR. Conductive pads PAD may be in the pad region PDR. The conductive pads PAD may be on the edge portions of the semiconductor substrate 110.

The semiconductor substrate 110 may include a first surface 110F1 and a second surface 110F2, which are opposite to each other. Here, for convenience, a surface of the semiconductor substrate 110, on which a color filter 186 is arranged, is referred to as the second surface 110F2, and a surface opposite to the second surface 110F2 is referred to as the first surface 110F1. In addition, it is illustrated that the second surface 110F2 is at a reference level LV0 and the first surface 110F1 is at a first vertical level L1 that is higher than the reference level LV0.

In an exemplary embodiment of the present inventive concept, the semiconductor substrate 110 may include a P-type semiconductor substrate. For example, the semiconductor substrate 110 may include a P-type silicon substrate. In an exemplary embodiment of the present inventive concept, the semiconductor substrate 110 may include a P-type bulk substrate and a P-type or N-type epitaxial layer grown on the P-type bulk substrate. In an exemplary embodiment of the present inventive concept, the semiconductor substrate 110 may include an N-type bulk substrate and a P-type or an N-type epitaxial layer grown on the N-type bulk substrate. In addition, the semiconductor substrate 110 may include an organic plastic substrate.

In the active pixel region APR, the plurality of pixels PX may be arranged in the form of a matrix in the semiconductor substrate 110. The plurality of photoelectric conversion regions PD may be respectively disposed in the plurality of pixels PX. The plurality of photoelectric conversion regions PD may each include a photodiode region and a well region.

In the active pixel region APR, a pixel device isolation film 120 may be in the semiconductor substrate 110, and the plurality of pixels PX may be defined by the pixel device isolation film 120. The pixel device isolation film 120 may be between adjacent photoelectric conversion regions PD of the plurality of photoelectric conversion regions PD. For example, one photoelectric conversion region PD and another photoelectric conversion region PD adjacent thereto may be physically and electrically isolated from each other by the pixel device isolation film 120. The pixel device isolation film 120 may be arranged between each of the plurality of photoelectric conversion regions PD arranged in the form of a matrix, and may have a grid shape or a mesh shape in a plan view.

The pixel device isolation film 120 may be formed in a pixel trench 120T that penetrates the semiconductor substrate 110 from the first surface 110F1 of the semiconductor substrate 110 to the second surface 110F2 of the semiconductor substrate 110. The pixel device isolation film 120 may include a conductive layer 122, a lower insulating layer 124L, an upper insulating layer 124U, and a buried insulating layer 126.

The pixel trench 120T has a shape in which an upper side expands in a lateral direction compared to a lower side, and may extend in a vertical direction. For example, the upper side of the pixel trench 120T may be wider than the lower side of the pixel trench 120T. An expanded upper side of the pixel trench 120T may be adjacent to the first surface 110F1 of the semiconductor substrate 110. For example, the expanded upper side may be of an upper portion of the pixel trench 120T. For example, the upper portion of the pixel trench 120T may extend from the first vertical level LV1 to a second vertical level LV2, which is lower than the first vertical level LV1. For example, a bottom portion (e.g., a lower surface) of the upper portion of the pixel trench 120T may be at a level that is substantially the same as the second vertical level LV2.

The lower insulating layer 124L and the upper insulating layer 124U may be separated from each other on an inner wall of the pixel trench 120T. For example, the upper insulating layer 124U may extend from the first vertical level LV1, which is at a height that is the same as the first surface 110F1 of the semiconductor substrate 110, to the second vertical level LV2 that is lower than the first vertical level LV1. In addition, the lower insulating layer 124L may extend from the reference level LV0, which is at a height that is the same as the second surface 110F2 of the semiconductor substrate 110, to the second vertical level LV2. For example, the upper insulating layer 124U may be on an inner wall of the upper portion of the pixel trench 120T.

The conductive layer 122 may be surrounded by the lower insulating layer 124L and the upper insulating layer 124U, and may fill the pixel trench 120T. The conductive layer 122 may include a pair of protrusion portions 122PS, which protrude in a lateral direction with respect to a main sidewall 122S in the upper portion of the pixel trench 120T. The pair of protrusion portions 122PS may be surrounded by the upper insulating layer 124U, and the main sidewall 122S of the conductive layer 122 may be surrounded by the lower insulating layer 124L. A top portion 122T of the conductive layer 122 may be in the upper portion of the pixel trench 120T, and may be at a level higher than a bottom surface of a device isolation trench 130T.

In an exemplary embodiment of the present inventive concept, the lower insulating layer 124L and the upper insulating layer 124U may each include a metal oxide such as hafnium oxide, aluminum oxide, tantalum oxide, and the like. In this case, the lower insulating layer 124L and the upper insulating layer 124U may function as negative fixed charge layers, but the present inventive concept is not limited thereto. In an exemplary embodiment of the present inventive concept, the lower insulating layer 124L and the upper insulating layer 124U may each include an insulating material such as silicon oxide, silicon nitride, silicon oxynitride, and the like. The conductive layer 122 may include at least one of doped polysilicon, a metal, a metal silicide, a metal nitride, or a metal-containing film.

The buried insulating layer 126 may be in a portion of the pixel trench 120T that is adjacent to the first surface 110F1 of the semiconductor substrate 110. The buried insulating layer 126 may be on the top portion 122T of the conductive layer 122 and may fill an inlet of the pixel trench 120T.

As illustrated in FIG. 3, a device isolation structure 130, which defines an active region ACT and a ground region GND, may be formed on the first surface 110F1 of the semiconductor substrate 110. The device isolation structure 130 may be in the device isolation trench 130T that is formed in a certain depth from the first surface 110F1 of the semiconductor substrate 110.

The device isolation structure 130 may include an insulating liner 132, a conductive liner 134, and a buried insulating layer 136, which are sequentially formed on an inner wall of the device isolation trench 130T. The insulating liner 132 and the conductive liner 134 may be conformally arranged on the inner wall of the device isolation trench 30T. In the device isolation trench 130T, the buried insulating layer 136 may be disposed on the conductive liner 134 and may fill the device isolation trench 30T. A top surface 134T of the conductive liner 134 may be coplanar with the first surface 110F1 of the semiconductor substrate 110, and may be at the first vertical level LV1.

In an exemplary embodiment of the present inventive concept, the insulating liner 132 may include, for example, silicon oxide, silicon nitride, silicon oxynitride, or combinations thereof. For example, the conductive liner 134 may include at least one of doped polysilicon, a metal, a metal silicide, a metal nitride, or a metal-containing film. In an exemplary embodiment of the present inventive concept, the insulating liner 132 and the conductive liner 134 may each have a thickness from about 5 nm to about 30 nm.

As shown in FIG. 6, the device isolation structure 130 may be formed to overlap the pixel trench 120T, and may be formed such that the device isolation structure 130 may cover a sidewall of the pixel device isolation film 120. For example, the buried insulating layer 136 may be arranged to surround a sidewall of the upper insulating layer 124U of the pixel device isolation film 120.

For example, in the overlap region, the conductive liner 134 of the device isolation structure 130 may be electrically connected to the conductive layer 122 of the pixel device isolation film 120. For example, as shown in FIG. 6, the upper portion 122T of the conductive layer 122 may be on a surface (e.g., an upper surface and/or upward facing surface) of the conductive liner 134 that is on the bottom portion of the device isolation trench 130T, and the surface of the conductive liner 134 may contact a bottom surface of the protrusion portion 122PS of the conductive layer 122. As another example, the upper portion 122T of the conductive layer 122 may be on the top surface 134T of the conductive liner 134. As the conductive liner 134 of the device isolation structure 130 is electrically connected to the conductive layer 122 of the pixel device isolation film 120, it may be configured that a negative bias is applied to the conductive liner 134 and the conductive layer 122 through a backside contact structure BC that is connected to the pad PAD and a voltage application line. A magnitude of the negative bias applied to the conductive liner 134 and the conductive layer 122 may vary according to a layout and design of the plurality of pixels PX.

The backside contact structure BC, which is electrically connected to the pixel device isolation film 120 and the device isolation structure 130, may be formed on the second surface 110F2 of the semiconductor substrate 110. As shown in FIG. 5, the backside contact structure BC may include a barrier conductive layer 192 and a buried conductive layer 194, which are in a backside contact hole BCT that is formed on the second surface 110F2 of the semiconductor substrate 110. The backside contact hole BCT may be formed on the second surface 110F2 of the semiconductor substrate 110 to be communicated with the pixel trench 120T. For example, the backside contact hole BCT may be connected with the pixel trench 120T. The barrier conductive layer 192 is formed with a predetermined thickness in the backside contact hole BCT. In the backside contact hole BCT, the buried conductive layer 194 may fill the backside contact hole BCT and may be disposed on the barrier conductive layer 192. In an exemplary embodiment of the present inventive concept, the backside contact hole BCT may be in the optical black pixel OBP. In an exemplary embodiment of the present inventive concept, the backside contact hole BCT may be not only in the optical black pixel OBP but also in some pixels PX in the active pixel region APR.

In an exemplary embodiment of the present inventive concept, the barrier conductive layer 192 may include at least one metal material, such as tungsten, aluminum, titanium, ruthenium, cobalt, nickel, copper, gold, silver, or platinum, and the buried conductive layer 194 may include at least one metal material, such as tungsten, aluminum, titanium, ruthenium, cobalt, nickel, copper, gold, silver, or platinum.

When the negative bias is applied to the conductive liner 134 and the conductive layer 122, holes may be accumulated in the semiconductor substrate 110 that is adjacent to the pixel device isolation film 120, and holes may also be accumulated around the active region ACT of the semiconductor substrate 110 that is adjacent to the device isolation structure 130. Therefore, occurrence of dark currents in the image sensor 100 may be reduced.

Transistors included in a pixel circuit may be in the active region ACT. For example, the active region ACT may be a portion of the semiconductor substrate 110, on which a transmission gate TG, a source follower gate SF, a selection gate SG, and a reset gate RG are arranged. In a portion of the active region ACT, for example, in a portion of the active region ACT that is adjacent to the transmission gate TG, a floating diffusion region FD may be arranged.

In an exemplary embodiment of the present inventive concept, as shown in FIG. 2, a first pixel PX-1, a second pixel PX-2, a third pixel PX-3, and a fourth pixel PX-4 may be arranged in the form of a matrix. The first pixel PX-1 and the third pixel PX-3, which are arranged next to each other in the second direction (e.g., the Y direction), may have a mirror symmetry shape with other with respect to an imaginary line extending in the first direction (e.g., the X direction) therebetween, and the first pixel PX-1 and the second pixel PX-2, which are arrange next to each other in the first direction (e.g., the X direction), may have a mirror symmetry shape with each other with respect to an imaginary line extending in the second direction (e.g., the Y direction) therebetween. In addition, the second pixel PX-2 may include the transmission gate TG and the reset gate RG, and the first pixel PX-1, the third pixel PX-3, and the fourth pixel PX-4 may each include the transmission gate TG, the source follower gate SF, and the selection gate SG. However, the layout shown in FIG. 2 merely corresponds to a layout of transistors according to an exemplary embodiment of the present inventive concept, and a layout of the transistors or a shape of the active region ACT is not limited thereto.

In an exemplary embodiment of the present invention, the transmission gate TG (see FIG. 2) may construct a transmission transistor TX (see FIG. 7), and the transmission transistor TX may be configured to transmit a charge, which is provided in the photoelectric conversion region PD, to the floating diffusion region FD. The reset gate RG (see FIG. 2) may construct a reset transistor RX (see FIG. 7), and the reset transistor RX may be configured to periodically reset the charge that is stored in the floating diffusion region FD. The source follower gate SF (see FIG. 2) may construct a drive transistor DX (see FIG. 7), and the drive transistor DX may be configured to function as a source follower buffer amplifier and buffer a signal according to the charge that is charged in the floating diffusion region FD. The selection gate SG (see FIG. 3) may construct a selection transistor SX (see FIG. 7), and the selection transistor SX may perform switching and addressing to select a pixel PX.

As illustrated in FIG. 3, the transmission gate TG may be referred to as a buried transmission gate electrode 140, and the buried transmission gate electrode 140 may be in a transmission gate trench 140T that extends from the first surface 110F1 of the semiconductor substrate 110 into the semiconductor substrate 110. The reset gate RG, the source follower gate SF, and the selection gate SG may each be referred to as a planar gate electrode 150, and may be on the first surface 110F1 of the semiconductor substrate 110. In an exemplary embodiment of the present inventive concept, the buried transmission gate electrode 140 and the planar gate electrode 150 may each include at least one of doped polysilicon, a metal, a metal silicide, a metal nitride, and a metal-containing film.

A buried transmission gate insulating layer 1401 may surround a sidewall and a bottom surface of the buried transmission gate electrode 140 on an inner wall of the transmission gate trench 140T. For example, a first lower surface of the transmission gate electrode 140 may be disposed on the buried transmission gate insulating layer 1401, and in the transmission gate trench 140T, the buried transmission gate insulating layer 1401 may be disposed on side surfaces and a second lower surface (e.g., a bottom surface) of the transmission gate electrode 140. A transmission gate spacer 140S may be on the sidewall of the buried transmission gate electrode 140.

The planar gate electrode 150 may be above the first surface 110F1 of the semiconductor substrate 110. A gate insulating layer 1501 may be between the first surface 110F1 of the semiconductor substrate 110 and the planar gate electrode 150, and a gate spacer 150S may be on a sidewall of the planar gate electrode 150. The gate spacer 150S may include a material that is the same as a material included in the transmission gate spacer 140S.

An interlayer insulating film 162 may be on the first surface 110F1 of the semiconductor substrate 110. The interlayer insulating film 162 may cover the active region ACT, the device isolation structure 130, the buried transmission gate electrode 140, and the planar gate electrode 150.

In an exemplary embodiment of the present inventive concept, the interlayer insulating film 162 may include silicon nitride and silicon oxynitride. In an example, the interlayer insulating film 162 may have a stack structure including a first insulating layer and a second insulating layer, and a density of the first insulating layer may be different from a density of the second insulating layer. In another example, the interlayer insulating film 162 may have a stack structure including a first insulating layer and a second insulating layer, and a content of nitrogen included in the first insulating layer may be different from a content of nitrogen included in the second insulating layer. In another example, an etch stop layer may be between the interlayer insulating film 162 and the first surface 110F1 of the semiconductor substrate 110, and the etch stop layer may include a material having an etch selectivity with respect to the interlayer insulating film 162.

A first contact CA1, which is connected to the buried transmission gate electrode 140, may be in a first contact hole CA1H that penetrates the interlayer insulating film 162. A second contact CA2, which is connected to the planar gate electrode 150, may be in a second contact hole CA2H that penetrates the interlayer insulating film 162. A third contact CA3, which is connected to the ground region GND or the active region ACT, may be in a third contact hole CA3H that penetrates the interlayer insulating film 162.

An upper wiring structure 170 may be on the interlayer insulating film 162. The upper wiring structure 170 may have a stack structure including a plurality of layers; however, the present inventive concept is not limited thereto. The upper wiring structure 170 may include an insulating layer 172, a wiring layer 174, and a via contact 176. The insulating layer 170 may include an insulating material such as silicon oxide, silicon nitride, and silicon oxynitride. The wiring layer 174 and the via contact 176 may each include at least one of polysilicon doped or not doped with impurities, a metal, a metal silicide, a metal nitride, and a metal-containing layer. For example, the wiring layer 174 and the via contact 176 may each include tungsten, aluminum, copper, tungsten silicide, titanium silicide, tungsten nitride, titanium nitride, doped polysilicon, and the like.

A rear surface insulating layer 182 may be on the second surface 110F2 of the semiconductor substrate 110. For example, the rear surface insulating layer 182 may be substantially on the entire area of the second surface 110F2 of the semiconductor substrate 110, and may contact a top surface of the pixel device isolation film 120 that is at a same level with the second surface 110F2 of the semiconductor substrate 110. In an exemplary embodiment of the present inventive concept, the rear surface insulating layer 182 may include a metal oxide such as hafnium oxide, aluminum oxide, or tantalum oxide. In an exemplary embodiment of the present inventive concept, the rear surface insulating layer 182 may include an insulating material such as silicon oxide, silicon nitride, silicon oxynitride, and a low-k dielectric material.

A passivation layer 184 may be on the rear surface insulating layer 182, and a color filter 186 and a microlens 188 may be on the passivation layer 184. In addition, a supporting substrate may be arranged on the first surface 110F1 of the semiconductor substrate 110.

As shown in FIG. 5, a light-shielding layer 196 may be on the optical black pixel OBP. In an exemplary embodiment of the present inventive concept, the light-shielding layer 196 may include at least one of tungsten, aluminum, titanium, ruthenium, cobalt, nickel, copper, gold, silver, or platinum. In an exemplary embodiment of the present inventive concept, the light-shielding layer 196 may include a material that is the same as the barrier conductive layer 192 of the backside contact structure BC and may be integrally formed, for example, with the barrier conductive layer 192, but the present inventive concept is not limited thereto. For example, the photoelectric conversion regions PD may be in some of the optical black pixels OBP, but not all of the photoelectric conversion regions PD. Some optical black pixels OBP may not include a photoelectric conversion region PD.

The optical black pixels OBP may function as reference pixels for the active pixel region APR, and may perform a function to automatically calibrate dark signals. For example, the light-shielding layer 196 may block light that is incident to the reference pixel in the optical black pixel OBP. By measuring a reference charge amount that may be generated in the reference pixel from which the light is blocked, and by comparing the reference charge amount to a sensing charge amount generated from the active pixel region APR, an optical signal input from the active pixel region APR may be calculated from a difference between the sensing charge amount and the reference charge amount.

According to a comparative example, to form the pixel device isolation film, the pixel trench that penetrates the semiconductor substrate is formed in a dry etch process and the like, and in the etch process, grid defects such as a dangling bond may be generated on a surface of the semiconductor substrate. The grid defects may cause a dark current of the image sensor.

However, the image sensor 100 according to an exemplary embodiment of the present inventive concept may be configured such that the conductive layer 122 of the pixel device isolation film 120 and the conductive liner 134 of the device isolation structure 130 are electrically connected to each other, and may be configured such that a negative bias is applied to the pixel device isolation film 120 and the device isolation structure 130. Accordingly, holes may be accumulated not only on the semiconductor substrate 110, which is adjacent to the pixel device isolation 120, but also around the active region ACT that is defined by the device isolation structure 130. The grid defects such as dangling bond may be cured by accumulating the holes, and by doing so, the image sensor 100 may have a reduced dark current.

Figure 7:
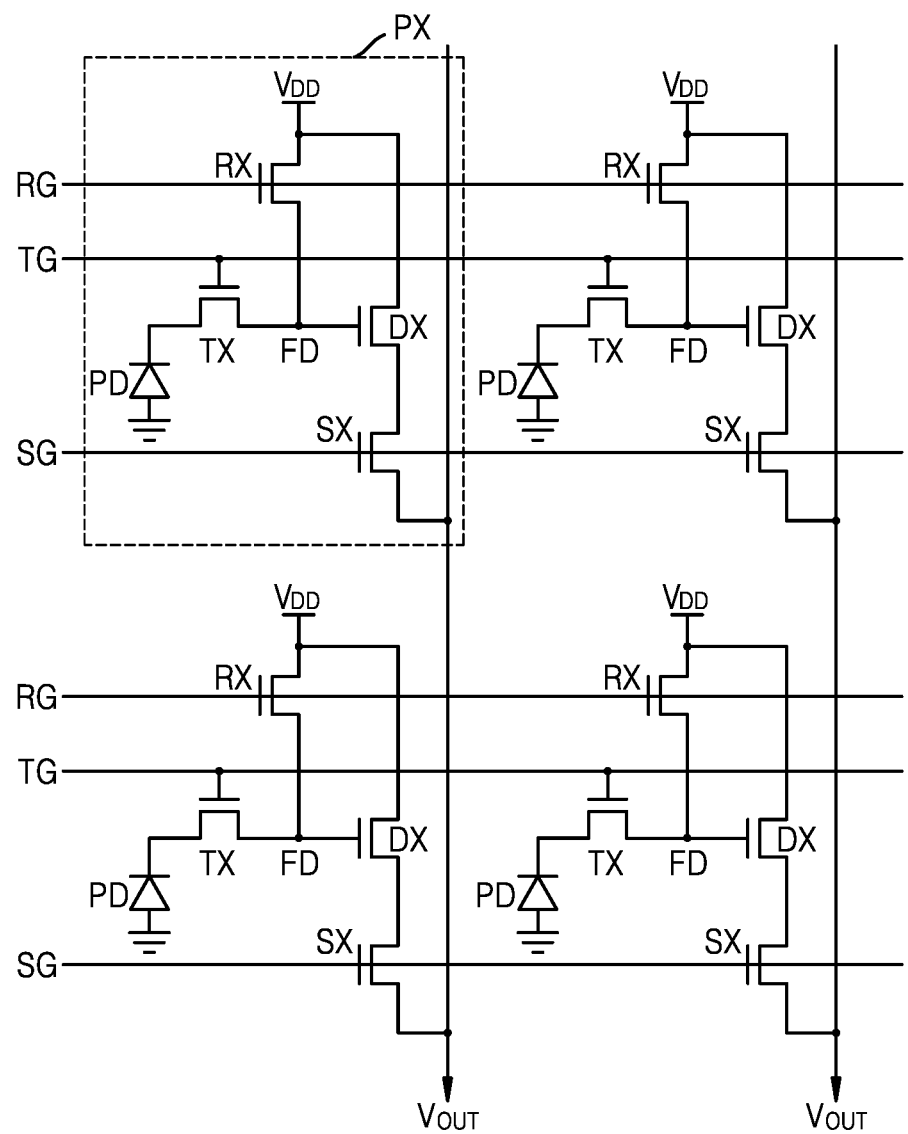
FIG. 7 is a circuit diagram of a pixel PX in an image sensor according to an exemplary embodiment of the present inventive concept.

FIG. 7 is a circuit diagram of the pixel PX of the image sensor 100 according to an exemplary embodiment of the present inventive concept.

Referring to FIG. 7, the plurality of pixels PX may be arranged in the form of a matrix. The plurality of pixels PX may each include the transmission transistor TX and logic transistors. Here, the logic transistors may include the reset transistor RX, the selection transistor SX, and the drive transistor (or a source follower transistor) DX. The reset transistor RX may include the reset gate RG. The selection transistor SX may include the selection gate SG. The drive transistor DX may include the source follower gate SF, and the transmission transistor TX may include the transmission gate TG.

The plurality of pixels PX may each include the photoelectric conversion region PD and the floating diffusion region FD. The photoelectric conversion region PD may correspond to the photoelectric conversion region PD described with reference to FIGS. 1 through 6. The photoelectric conversion region PD may generate and accumulate photocharges in proportion to an amount of light incident from outside, and may use a photodiode, a photo transistor, a photo gate, a pinned photo diode (PDD), or combinations thereof.

The transmission gate TG may transmit the photocharges, which are generated in the photoelectric conversion region PD, to the floating diffusion region FD. The floating diffusion region FD may receive the photocharges, which are generated in the photoelectric conversion region PD, and store the photocharges by accumulation. The drive transistor DX may be controlled according to an amount of the photocharges accumulated in the floating diffusion region FD.

The reset transistor RX may periodically reset the photocharges accumulated in the floating diffusion region FD. A drain electrode of the reset transistor RX is connected to the floating diffusion region FD, and a source electrode of the reset transistor RX is connected to a power voltage $V_{DD}$. When the reset transistor RX is turned on, the power voltage $V_{DD}$, which is connected to the source electrode of the reset transistor RX, is provided to the floating diffusion region FD. When the reset transistor RX is turned on, the photocharges accumulated in the floating diffusion region FD may be discharged, and thus, the floating diffusion region FD may be reset.

The drive transistor DX, which is connected to a current source outside the plurality of pixels PX, functions as a source follower buffer amplifier and amplifies a potential change in the floating diffusion region FD and outputs the potential change to an output line $V_{OUT}$.

The selection transistor SX may select the plurality of pixels PX in row units, and when the selection transistor SX is turned on, the power voltage $V_{DD}$ may be provided to a source electrode of the drive transistor DX.

Figure 8:
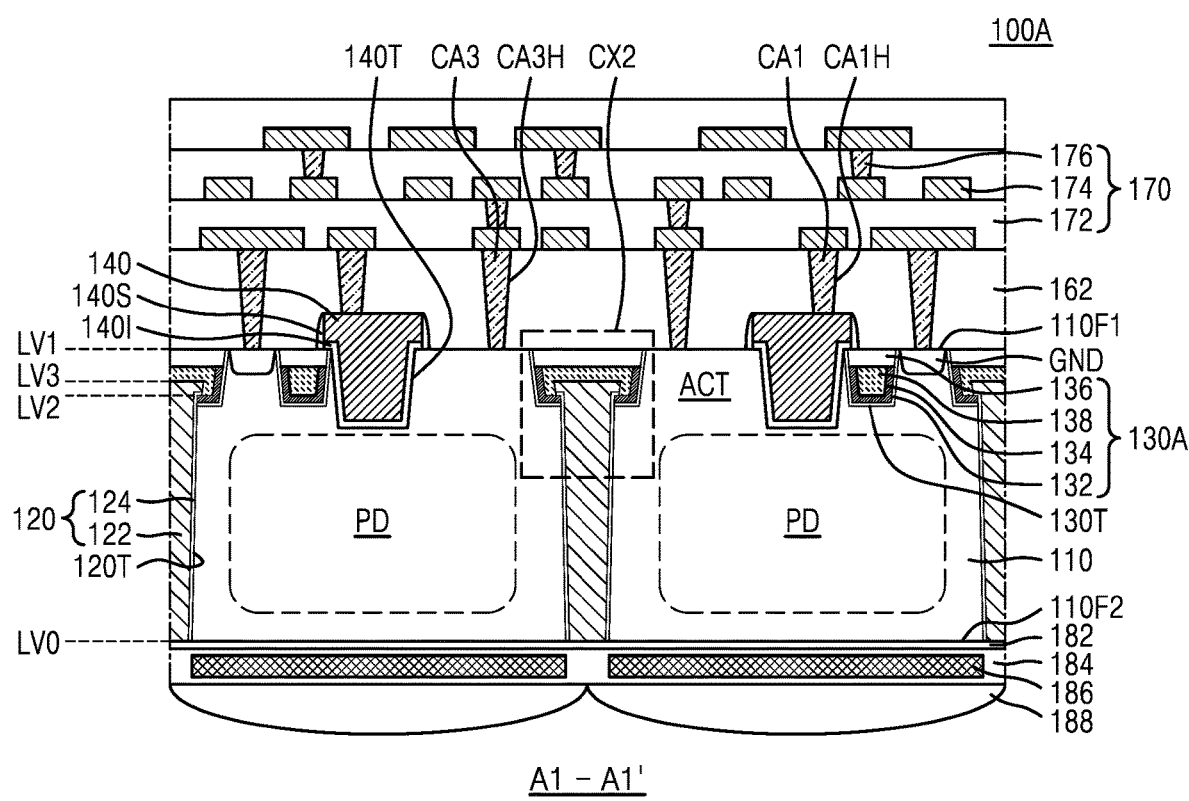
FIG. 8 is a cross-sectional view of an image sensor according to an exemplary embodiment of the present inventive concept.
Figure 9:
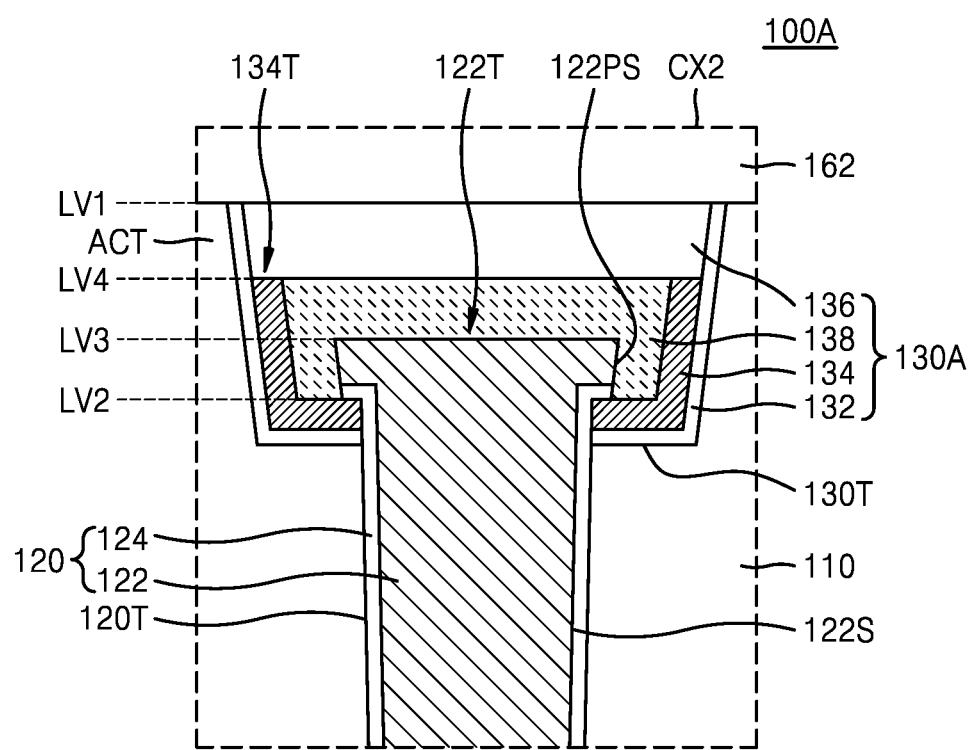
FIG. 9 is an enlarged view of portion CX2 shown in FIG. 8.

FIG. 8 is a cross-sectional view of an image sensor 100A according to an exemplary embodiment of the present inventive concept, and FIG. 9 is an enlarged view of portion CX2 shown in FIG. 8. In FIGS. 8 and 9, reference numerals that are the same as those of FIGS. 1 through 7 indicate the same components, and thus redundant descriptions may be omitted.

Referring to FIGS. 8 and 9, a device isolation structure 130A may include the insulating liner 132, the conductive liner 134, the buried insulating layer 136, and a gap-fill conductive layer 138. The conductive layer 122 of the pixel device isolation film 120 may not directly contact the conductive liner 134, and the gap-fill conductive layer 138 may fill a space between the conductive layer 122 and the conductive liner 134. The pair of protrusion portions 122PS of the conductive layer 122 may be surrounded by the gap-fill conductive layer 138.

A top surface of the gap-fill conductive layer 138 is on a fourth vertical level LV4 that is lower than the first vertical level LV1, and the top surface 134T of the conductive liner 134 may be at the fourth vertical level LV4, like the top surface of the gap-fill conductive layer 138. The buried insulating layer 136, on the conductive liner 132, may cover both of the top surface 134T of the conductive liner 134 and the top surface of the gap-fill conductive layer 138, and may fill an upper portion of the device isolation trench 130T.

According to an exemplary embodiment of the present inventive concept, as the gap-fill conductive layer 138 is provided between the conductive liner 134 and the conductive layer 122, a contact area between the gap-fill conductive layer 138 and the conductive liner 134 and a contact area between the gap-fill conductive layer 138 and the conductive layer 122 may relatively increase, and accordingly, a sufficient electrical connection between the conductive liner 134 and the conductive layer 122 may be secured.

Figure 10:
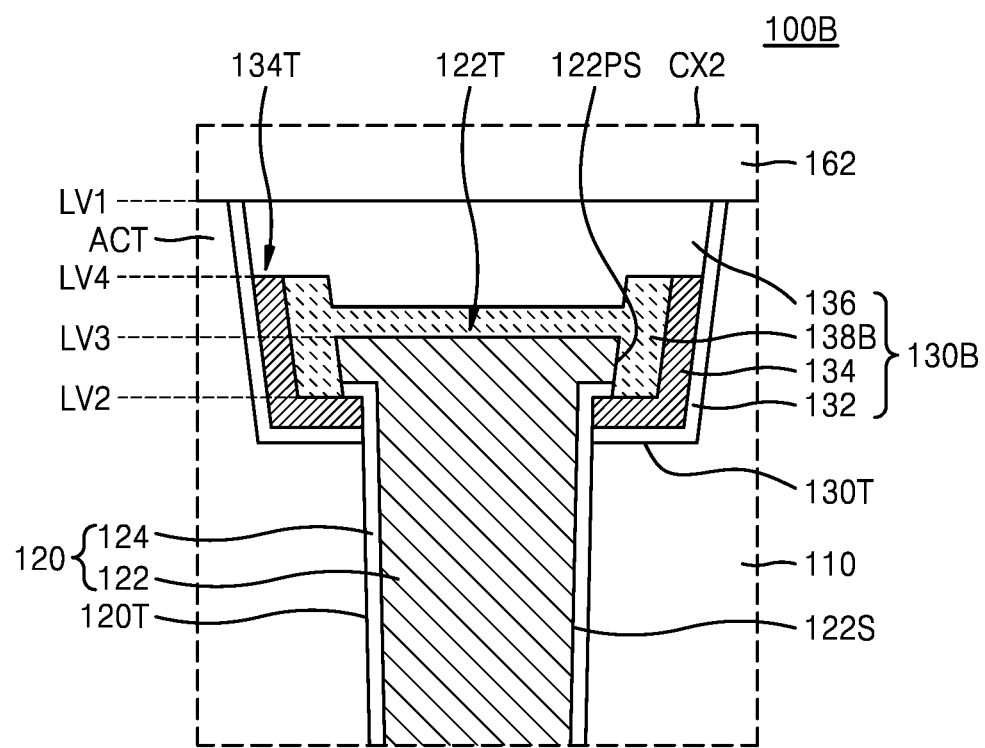
FIG. 10 is a cross-sectional view of an image sensor according to an exemplary embodiment of the present inventive concept.

FIG. 10 is a cross-sectional view of an image sensor 100B according to an exemplary embodiment of the present inventive concept.

Referring to FIG. 10, a gap-fill conductive layer 138B may have an uneven top surface level in the device isolation trench 130T. For example, a thickness of a portion of the gap-fill conductive layer 138B on the sidewall of the device isolation trench 130T may be equal or similar to a thickness of a portion of the gap-fill conductive layer 138B on a bottom portion of the device isolation trench 130T (or the top portion 122T of the conductive layer 122). For example, the gap-fill conductive layer 138B may have a groove.

Figure 11:
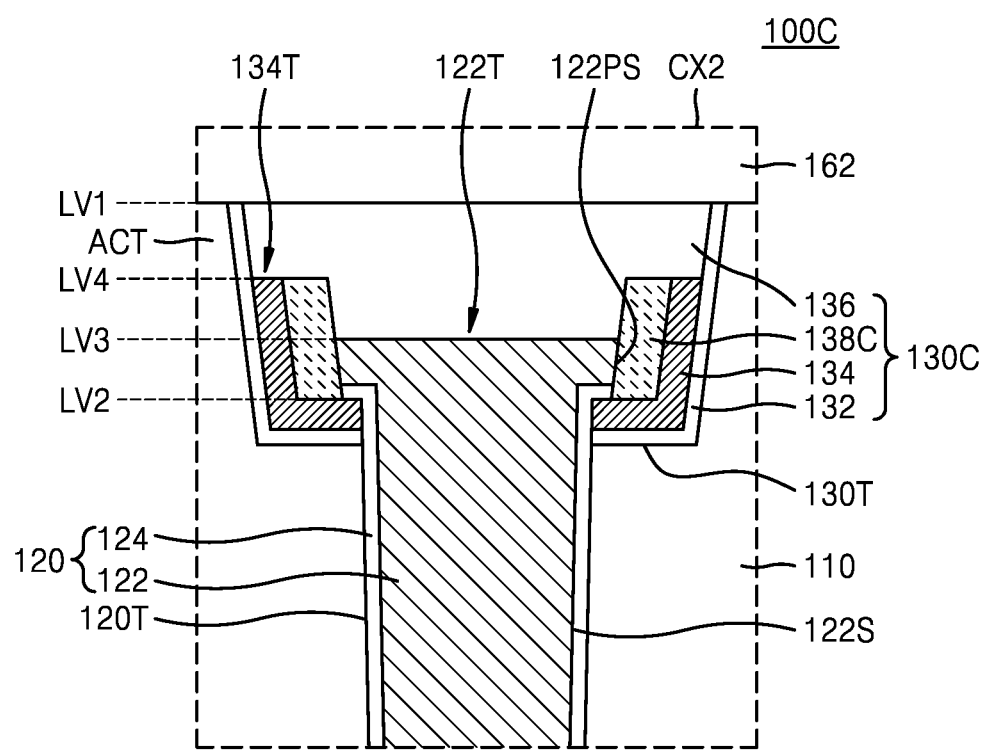
FIG. 11 is a cross-sectional view of an image sensor according to an exemplary embodiment of the present inventive concept.

FIG. 11 is a cross-sectional view of an image sensor 100C according to an exemplary embodiment of the present inventive concept.

Referring to FIG. 11, a gap-fill conductive 138C may be on the sidewall of the device isolation trench 130T and not on the top portion 122T of the conductive layer 122. The pair of protrusion portions 122PS of the conductive layer 122 may be surrounded by the gap-fill conductive layer 138C, and the top portion 122T of the conductive layer 122 may be covered by the buried insulating layer 136. For example, the buried insulating layer 136 may be directly disposed on the top portion 122T of the conductive layer 122.

Figure 12:
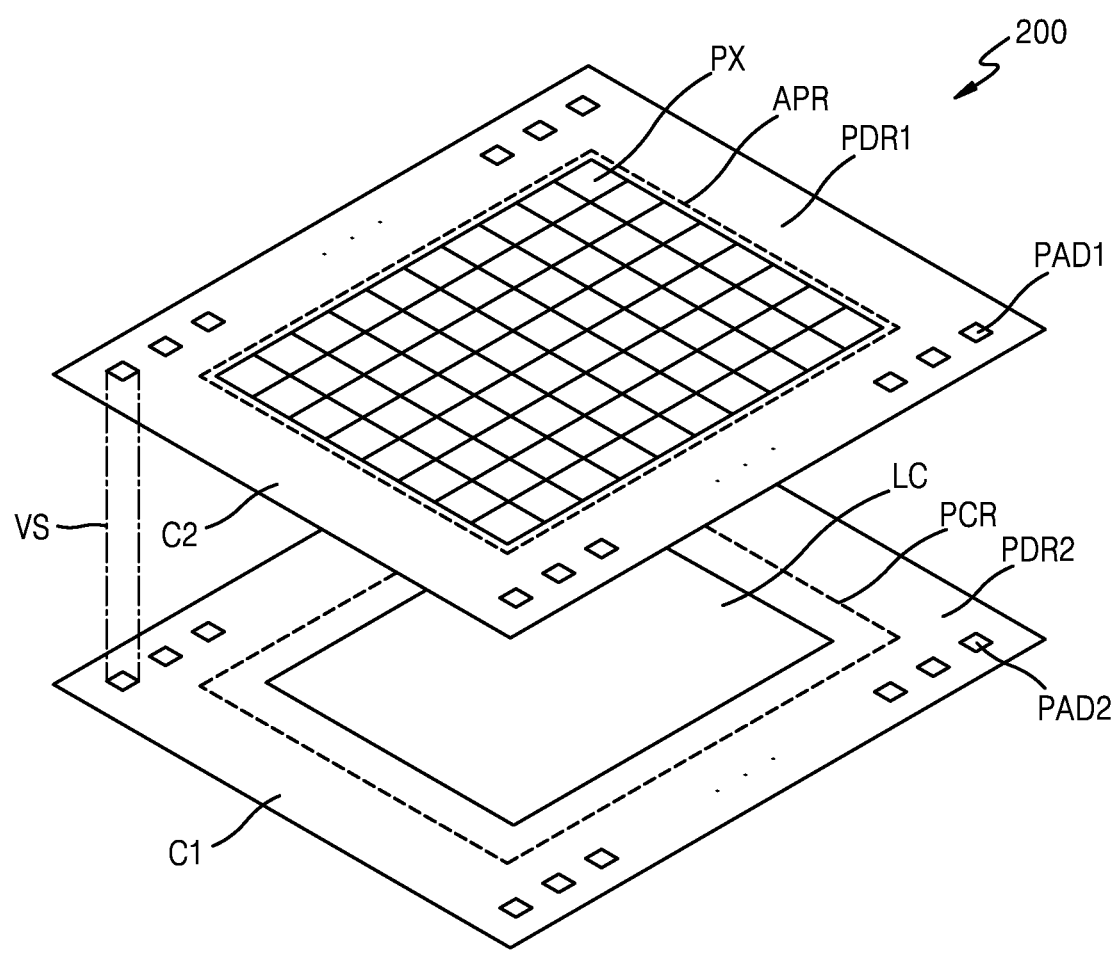
FIG. 12 is a schematic diagram of an image sensor according to an exemplary embodiment of the present inventive concept.

FIG. 12 is a schematic diagram of an image sensor 200 according to an exemplary embodiment of the present inventive concept.

Referring to FIG. 12, the image sensor 200 may include a stack-type image sensor including a first chip C1 and a second chip C2 that are stacked in a vertical direction. The first chip C1 may include the active pixel region APR and the first pad region PDR1, and the second chip C2 may include the peripheral circuit region PCR and a second pad region PDR2.

A plurality of first pads PAD1 in the first pad region PDR1 may be configured to transmit/receive electrical signals to/from an external device. The peripheral circuit region PCR may include a logic circuit block LC, and may also include a plurality of complementary metal oxide semiconductor (CMOS) transistors. The peripheral circuit region PCR may provide certain signals to each of active pixels PX in the active pixel region APR or may control an output signal from each of the active pixels PX. The plurality of first pads PAD1 in the first pad region PDR1 may be electrically connected to second pads PAD2 in the second pad region PDR2 by via structures VS.

FIGS. 13 through 25 are cross-sectional views showing a method of manufacturing the image sensor 100 according to an exemplary embodiment of the present inventive concept. In FIGS. 13 through 25, reference numerals that are the same as those of FIGS. 1 through 12 indicate same components, and thus redundant descriptions may be omitted.

Figure 13:
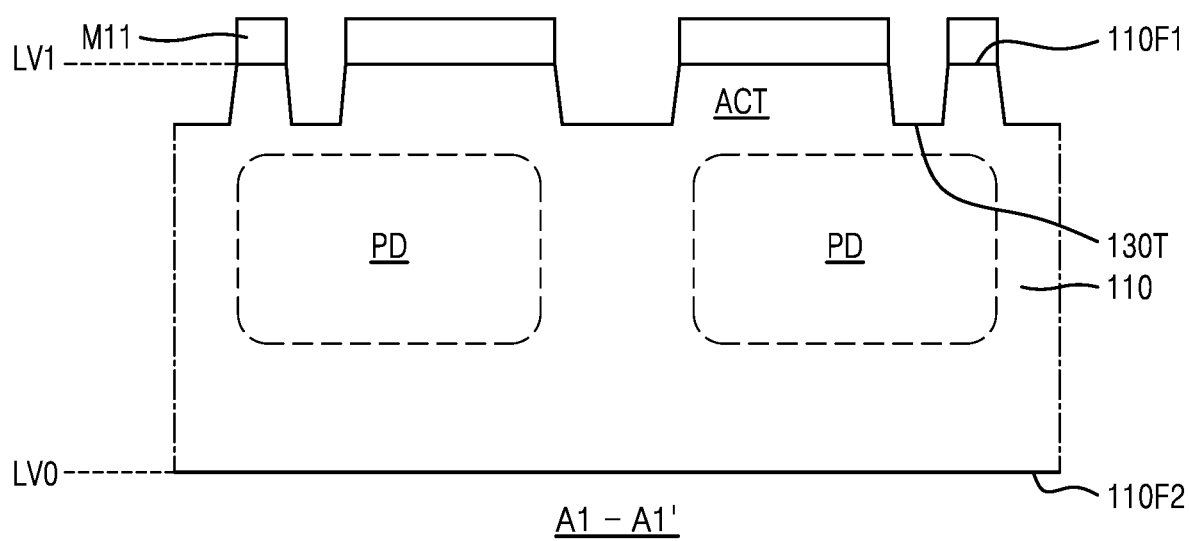
FIGS. 13, 14, 15, 16, 17, 18, 19, 20, 21, 22, 23, 24, and 25 are cross-sectional views illustrating a method of manufacturing an image sensor according to an exemplary embodiment of the present inventive concept.

Referring to FIG. 13, the semiconductor substrate 110, which includes the first surface 110F1 and the second surface 110F2 opposite to each other, is provided. Here, the second surface 110F2 may be at the reference level LV0, and the first surface 110F1 may be at the first vertical level LV1.

The photoelectric conversion region PD may be formed from the first surface 110F1 of the semiconductor substrate 110 by an ion implantation process. For example, the photoelectric conversion region PD may include a photodiode region and a well region, in which the photodiode region may be formed by doping with N-type impurities and the well region may be formed by doping with P-type impurities.

Thereafter, a first mask pattern M11 may be formed on the first surface 110F1 of the semiconductor substrate 110, and the device isolation trench 130T may be formed in the semiconductor substrate 110 by using a mask pattern M11.

Figure 14:
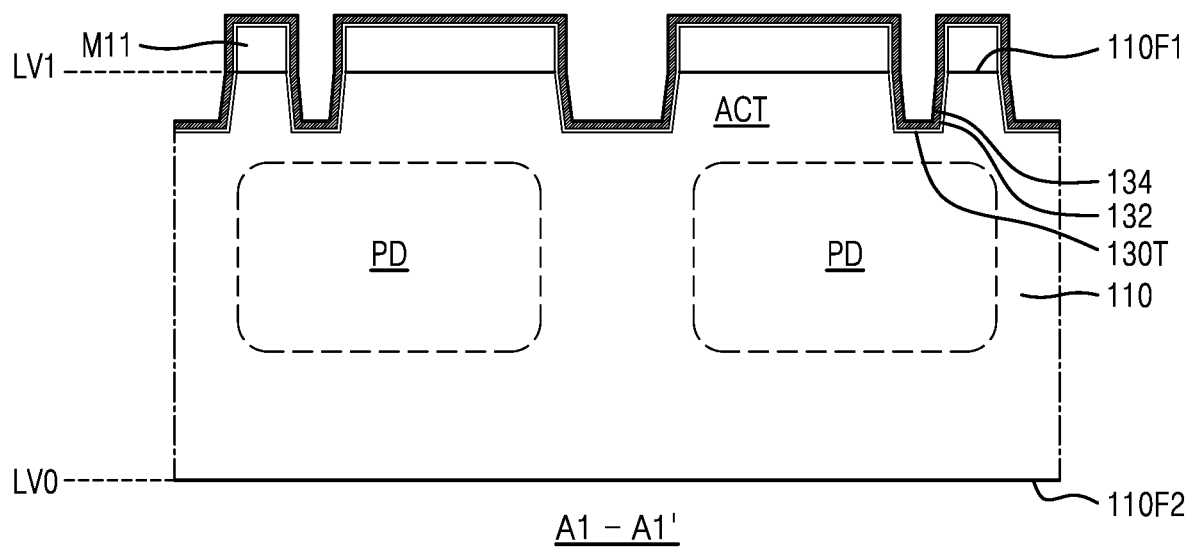

Referring to FIG. 14, the insulating liner 132 and the conductive liner 134 may be conformally formed on the first mask pattern M11 and in the device isolation trench 130T. In an exemplary embodiment of the present inventive concept, the insulating liner 132 and the conductive liner 134 may each be formed with a thickness from about 5 nm to about 30 nm. The insulating liner 132 and the conductive liner 134 may not completely fill the device isolation trench 130T.

In an exemplary embodiment of the present inventive concept, the insulating liner 132 may include, for example, silicon oxide, silicon nitride, silicon oxynitride, or combinations thereof. In an exemplary embodiment of the present inventive concept, the insulating liner 132 may be formed to have a double-layered structure including a silicon oxide film and a silicon nitride film. The conductive liner 134 may include at least one of doped polysilicon, a metal, a metal silicide, a metal nitride, and/or a metal-containing film.

Figure 15:
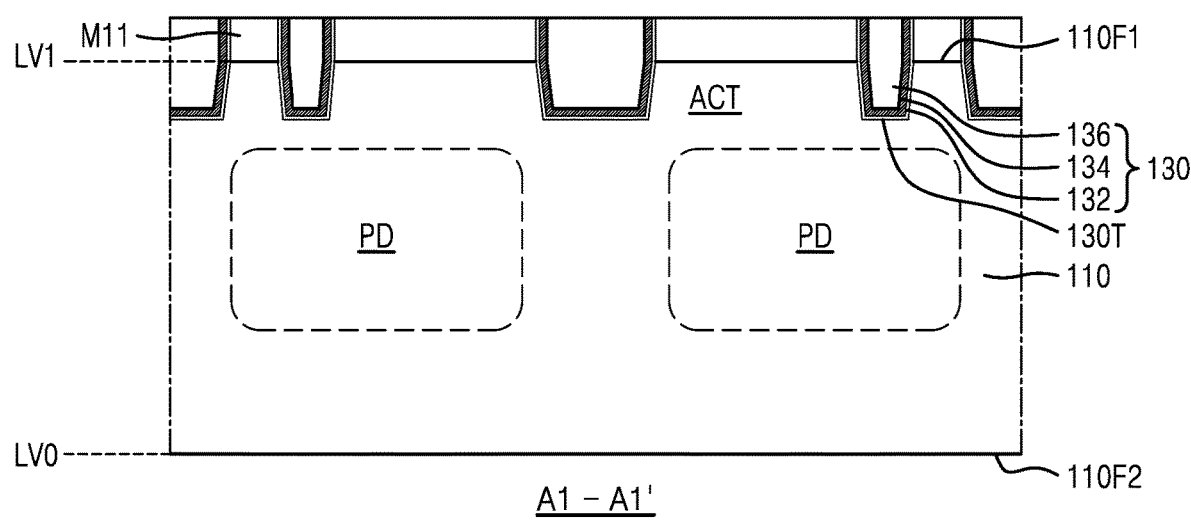

Referring to FIG. 15, the buried insulating layer 136 may be formed in the device isolation trench 130T by forming an insulating layer that fills the device isolation trench 130T on the conductive liner 134, and by removing a top portion of the insulating layer until a top surface of the first mask patter M11 is exposed. Here, a portion of the conductive liner 134 and a portion of the insulating liner 132, which are on the top surface of the first mask pattern M11, are both removed, and a portion of the conductive liner 134 and a portion of the insulating liner 132 in the device isolation trench 130T may remain.

Figure 16:
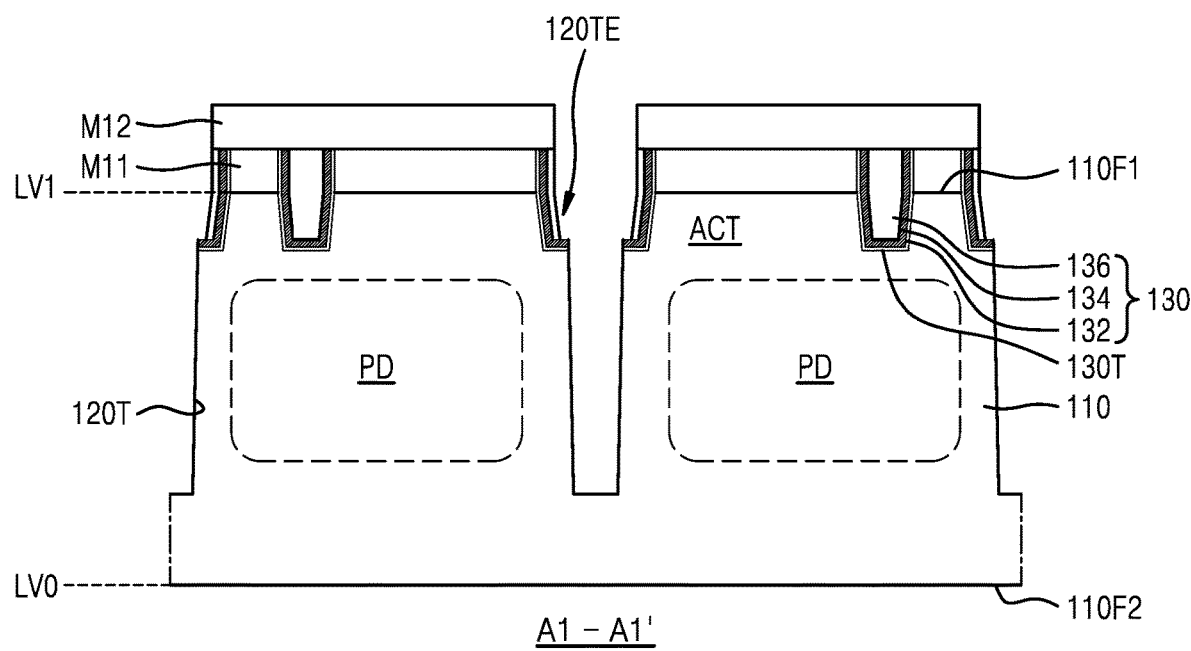

Referring to FIG. 16, a second mask patter M12 is formed on the first surface 110F1 of the semiconductor substrate 110, and the pixel trench 120T may be formed in the semiconductor substrate 110 by using the second mask pattern M12. The pixel trench 120T may have a predetermined depth from the first surface 110F1, and may be formed in the form of a matrix in a plan view.

In a process of forming the pixel trench 120T, a region overlapping the device isolation structure 130, that is, a portion of the buried insulating layer 136 that is exposed by the pixel trench 120T, may be more exposed to an etching atmosphere and may be removed. At the top portion of the pixel trench 120T, the buried insulating layer 136 may be removed more in a lateral direction, and accordingly, the expanded top side 120TE may be formed.

Figure 17:
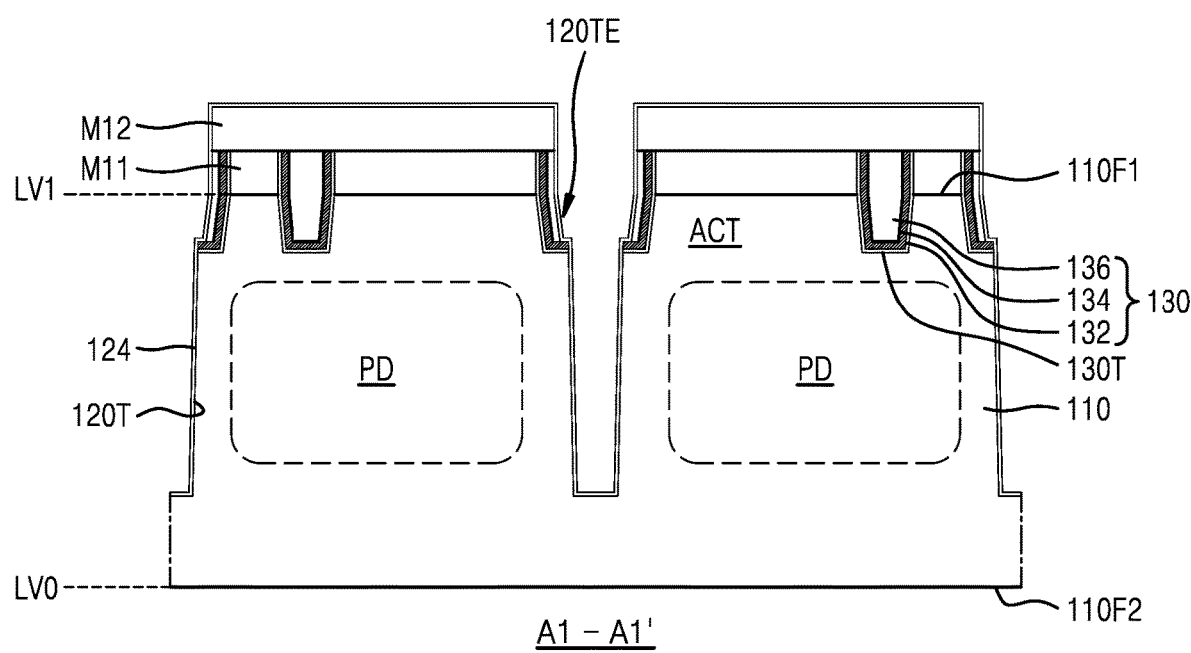

Referring to FIG. 17, on inner walls of the second mask pattern M12 and the pixel trench 120T, the insulating layer 124 may be conformally formed by chemical vapor deposition (CVD) process and an atomic layer deposition (ALD) process.

Figure 18:
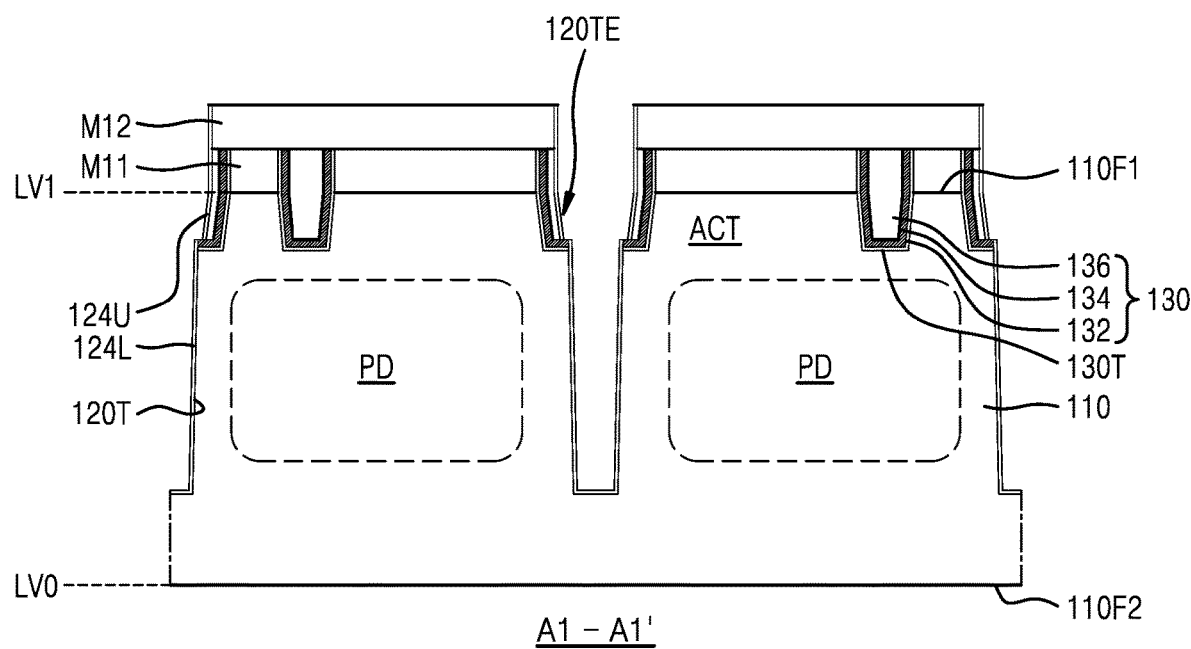

Referring to FIG. 18, by performing an anisotropy etch process on the insulating layer 124, a portion of the insulating layer 124 may be removed from the expanded top side 120TE of the pixel trench 120T, and an upper surface (e.g., an upward facing surface) of the conductive liner 134, which is in the expanded top side 120TE, may be exposed. In an exemplary embodiment of the present inventive concept, in the anisotropy etch process on the insulating layer 124, a portion of the insulating layer 124 on the second mask patter M12 is removed, and another portion of the insulating layer 124 may remain on an inner wall of the expanded top side 120TE and the inner wall of the pixel trench 120T. Here, the portion of the insulating layer 124 remaining on the inner wall of the expanded top side 120TE may be referred to as the upper insulating layer 124U, and the other portion of the insulating layer 124 remaining on the inner wall of the pixel trench 120T may be referred to as the lower insulating layer 124L.

Figure 19:
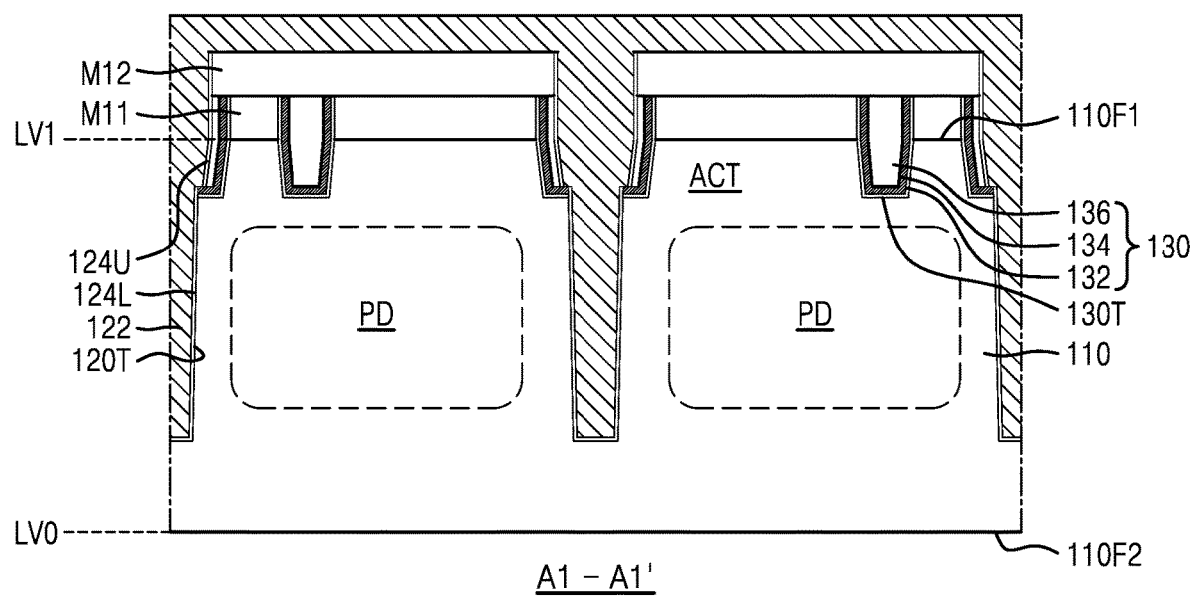

Referring to FIG. 19, the conductive layer 122, which fills the inner wall of the pixel trench 120T, may be formed on the upper insulating layer 124U and the lower insulating layer 124L. In a process of forming the conductive layer 122, the conductive liner 134 and the conductive layer 122 that are exposed at a bottom portion of the expanded top side 120TE (see FIG. 18) may contact each other.

Figure 20:
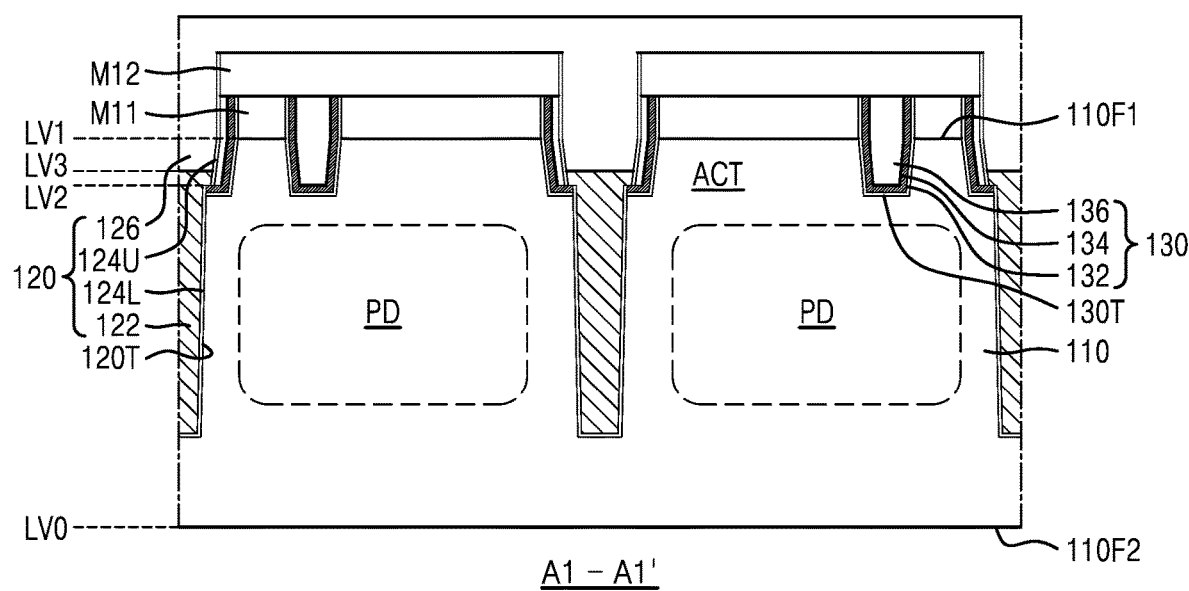

Referring to FIG. 20, the top portion of the conductive layer 122 may be removed by, for example, an etch back process until the top surface of the conductive layer 122 reaches a third vertical level LV3 that is lower than top of the first surface 110F of the semiconductor substrate 110.

Thereafter, an inlet of the pixel trench 120T may be filled with the buried insulating layer 126.

Figure 21:
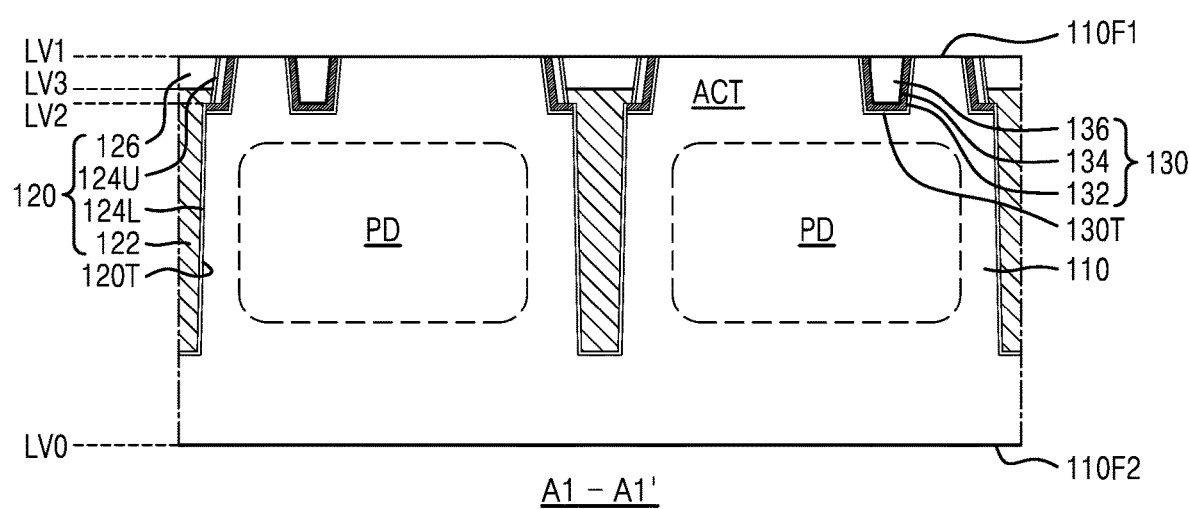

Referring to FIG. 21, a top side of the buried insulating layer 126 may be removed by planarizing the top side of the buried insulating layer 126 until the first surface 110F1 of the semiconductor substrate 110 is exposed. In the process of removing the top side of the buried insulating layer 126, top portions of the second mask pattern M12, the first mask pattern M11, and the device isolation structure 130 may be removed together.

Figure 22:
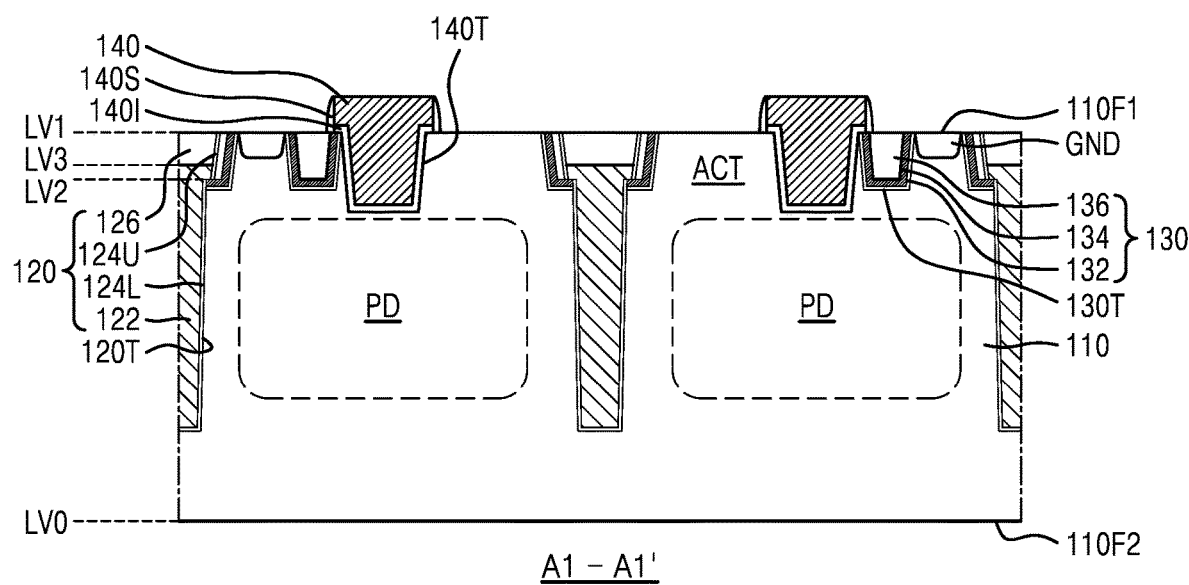

Referring to FIG. 22, a mask pattern is formed on the first surface 110F1 of the semiconductor substrate 110, and the transmission gate trench 140T may be formed by removing a portion of the semiconductor substrate 110 by using the mask pattern as an etch mask.

Thereafter, the gate insulating layer 140I may be conformally formed on the first surface 110F1 of the semiconductor substrate 110 and the inner wall of the transmission gate trench 140T.

A conductive layer may be formed on the gate insulating layer 140I in transmission gate trench 140T and may fill the transmission gate trench 140T, and the conductive layer may be patterned to form the transmission gate electrode 140 in the transmission gate trench 140T and the planar gate electrode 150 (see FIG. 4) on the first surface 110F1 of the semiconductor substrate 110. In an exemplary embodiment of the present inventive concept, the transmission gate electrode 140 and the planar gate electrode 150 may include, for example, at least one of doped polysilicon, a metal, a metal silicide, a metal nitride, and a metal-containing layer.

Thereafter, the transmission gate spacer 140S and the planar gate spacer 150S (see FIG. 4) may be formed on sidewalls of the transmission gate electrode 140 and the planar gate electrode 150, respectively. For example, an impurity region may be formed by performing an ion implantation process on a region on the first surface 110F1 of the semiconductor substrate 110.

Figure 23:
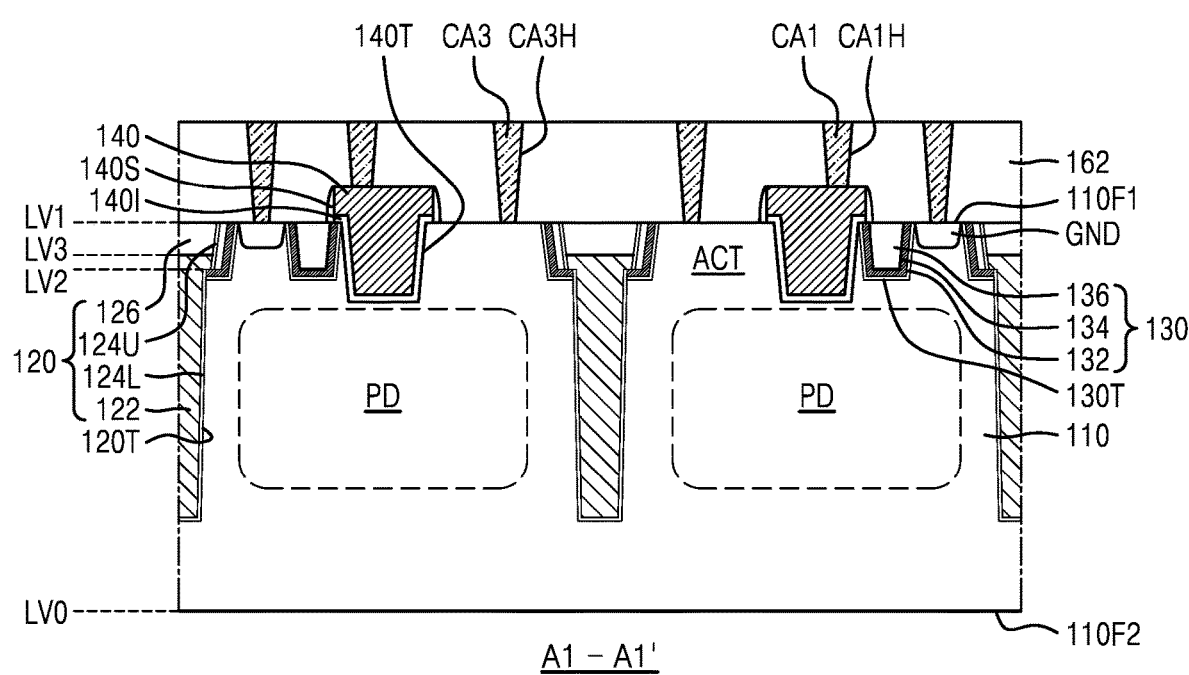

Referring to FIG. 23, the interlayer insulating film 162 may be formed on the first surface 110F1 of the semiconductor substrate 110. In an exemplary embodiment of the present inventive concept, the interlayer insulating film 162 may be formed in a sufficient height to cover the transmission gate electrode 140 and the planar gate electrode 150. For example, the interlayer insulating film 162 may cover upper and side surfaces of the transmission gate electrode 140 and the planar gate electrode 150.

Before forming the interlayer insulating film 162, an etch stop layer may be formed on the first surface 110F1 of the semiconductor substrate 110.

Thereafter, a mask pattern may be formed on the interlayer insulating film 162, and the first contact hole CA1H, the second contact hole CA2H, and the third contact hole CA3H that penetrate the interlayer insulating film 162 may be formed by using the mask pattern as an etch mask.

Next, a conductive layer filling the first contact hole CA1H, the second contact hole CA2H, and the third contact hole CA3H is formed on the interlayer insulating film 162, and the first contact CA1, the second contact CA2, and the third contact CA3 may be respectively formed in the first contact hole CA1H, the second contact hole CA2H, and the third contact hole CA3H by planarizing a top side of the conductive layer until a top surface of the interlayer insulating film 162 is exposed.

Figure 24:
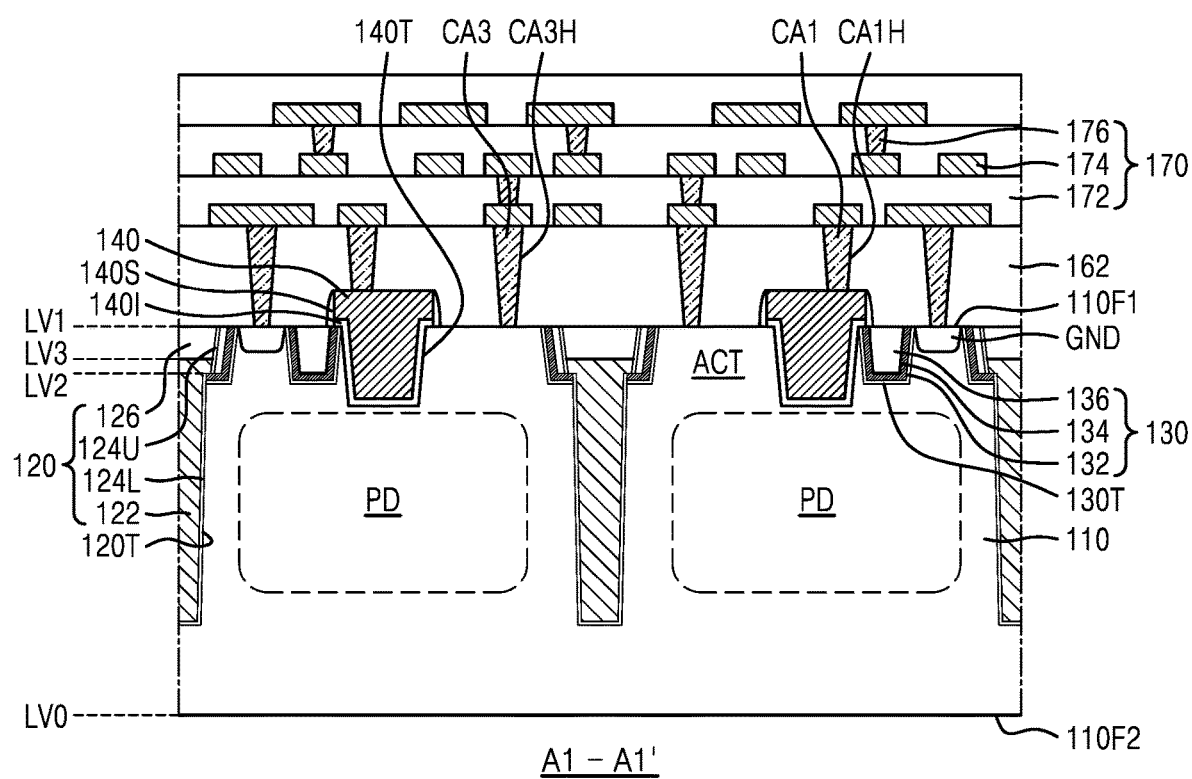

Referring to FIG. 24, the upper wiring structure 170 including the insulating layer 172, the wiring layer 174, and the via contact 176 may be formed by repeatedly performing operations of forming a conductive layer on the interlayer insulating film 162, patterning the conductive layer, and forming an insulating layer to cover the patterned conductive layer.

Figure 25:
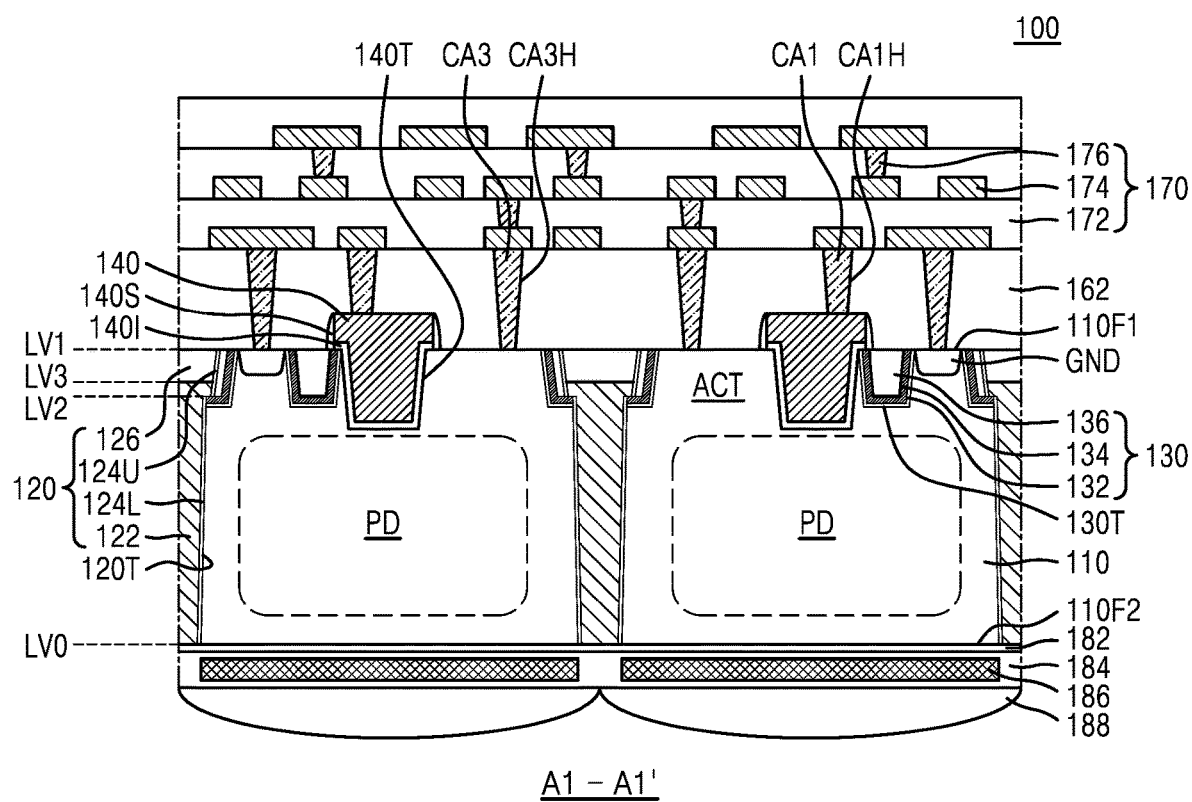

Referring to FIG. 25 in conjunction with FIG. 5, a supporting substrate may be attached onto the first surface 110F1 of the semiconductor substrate 110, and the semiconductor substrate 110 may be turned over such that the second surface 110F2 of the semiconductor substrate 110 faces upward.

Thereafter, a portion of the semiconductor substrate 110 may be removed from the second surface 110F2 of the semiconductor substrate 110 by a planarizing process such as a CMP process or an etch back process until the top surface of the pixel device isolation film 120 (e.g., an end portion adjacent to the second surface 110F2 of the semiconductor substrate 110) is exposed. As the removal process of the portion of the semiconductor substrate 110 from the second surface 110F2 is performed, the reference level LV0 of the second surface 110F2 of the semiconductor substrate 110 may change (e.g., descend).

Thereafter, the rear surface insulating layer 182 may be formed on the second surface 110F2 of the semiconductor substrate 110. The rear surface insulating layer 182, which covers the pixel device isolation film 120, may be formed on the second surface 110F2 of the semiconductor substrate 110. For example, the rear surface insulating layer 182 may be formed on the entire area of the second surface 110F2 of the semiconductor substrate 110.

Next, with reference to FIG. 5, in the optical black pixel OBP, the backside contact hole BCT may be formed by removing a portion of a thickness of the second surface 110F2 of the semiconductor substrate 110. The backside contact hole BCT may be connected to the pixel trench 120T.

The barrier conductive layer 192 may be formed on an inner wall of the backside contact hole BCT, and the light-shielding layer 196 may be formed to cover the top surface of the optical black pixels OBP. For example, the light-shielding layer 196 may be formed to cover the entire top surface of the optical black pixels OBP. The barrier conductive layer 192 and the light-shielding layer 196 may be simultaneously formed by using a same material, but the present inventive concept is not limited thereto. Next, a buried conductive layer 194 filling the backside contact hole BCT may be formed.

Thereafter, with reference to FIG. 25, the passivation layer 184 may be formed on the rear surface insulating layer 182, and the color filter 186 and the microlens 188 may be formed on the passivation layer 184.

The image sensor 100 may be formed by the above-described processes.

FIGS. 26 through 34 are cross-sectional views showing a method of manufacturing the image sensor 100A according to an exemplary embodiment of the present inventive concept.

First, a structure including the insulating liner 132, the conductive liner 134, and a buried insulating layer 210 is formed in the device isolation trench 130T, and then the pixel trench 120T is formed, by performing the processes described with reference to FIGS. 13 through 16.

Figure 26:
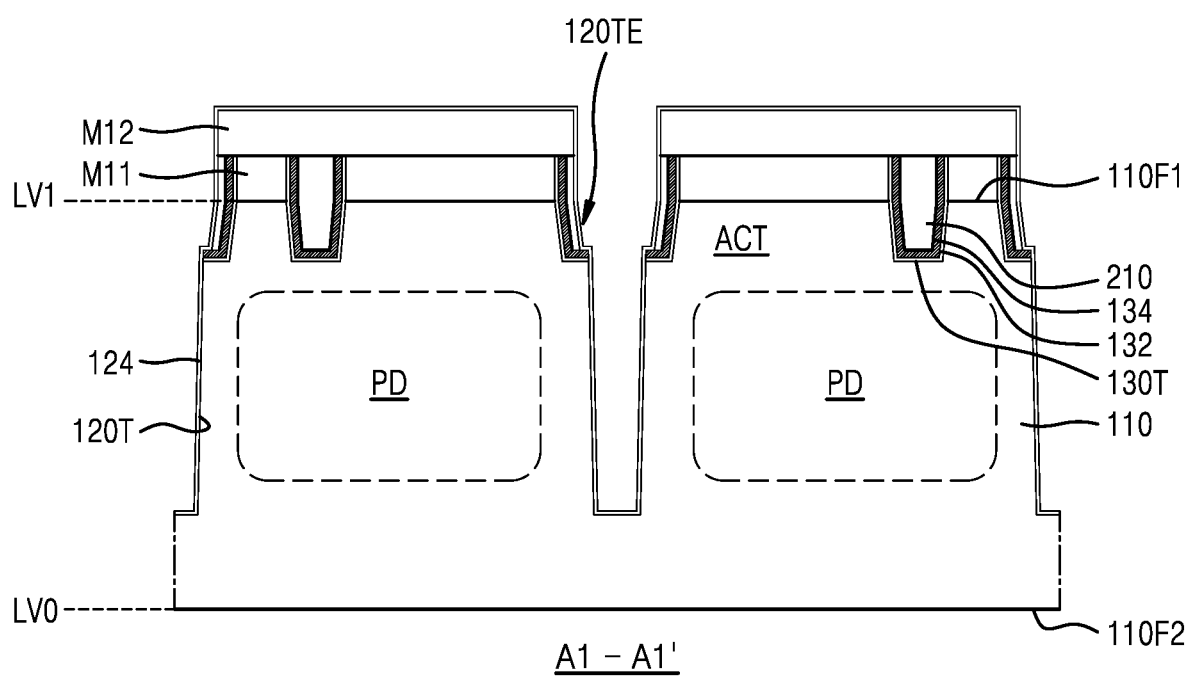
FIGS. 26, 27, 28, 29, 30, 31, 32, 33, and 34 are cross-sectional views illustrating a method of manufacturing an image sensor according to an exemplary embodiment of the present inventive concept.

Referring to FIG. 26, the insulating layer 124 may be formed on an inner wall of the pixel trench 120T. The insulating layer 124 may cover the top surface 134T (see FIG. 6) of the conductive liner 134. For example, the insulating layer 124 may completely cover the top surface 134T of the conductive liner 134. In addition, the insulating layer 124 may cover an upper surface (or, e.g., an upward facing surface) of conductive liner 134.

Figure 27:
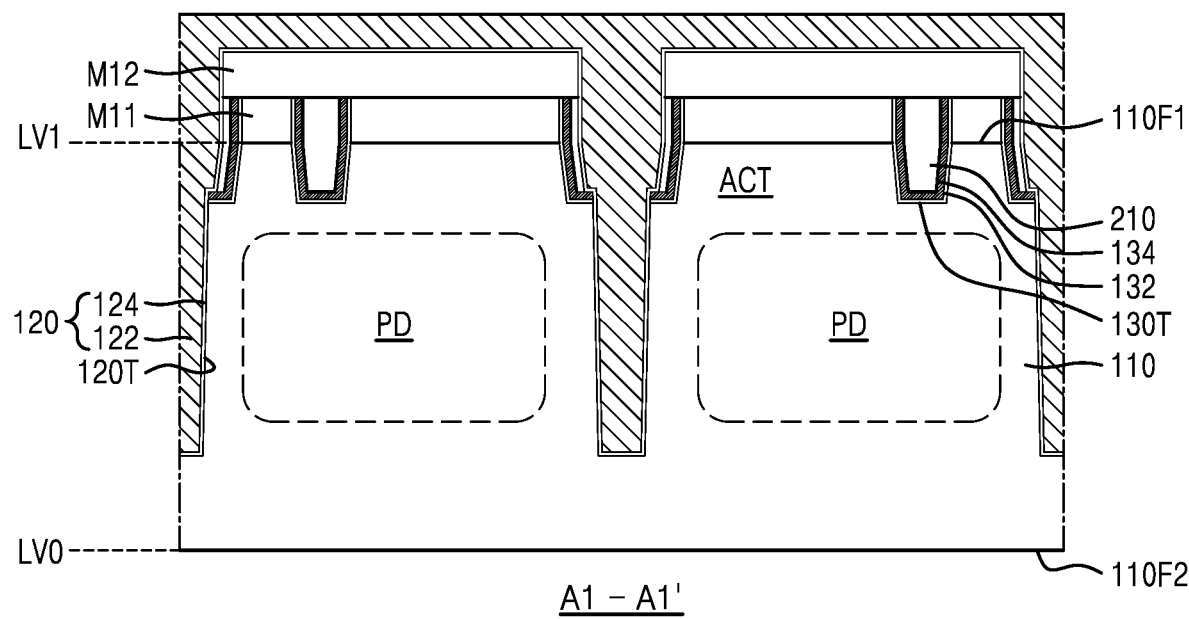

Referring to FIG. 27, the conductive layer 122 filling the pixel trench 120T may be formed on the insulating layer 124. In a process of forming the conductive layer 122, the insulating layer 124 is on the bottom portion of the expanded top side 120TE, and therefore, the conductive layer 122 and the conductive liner 134 may not directly contact each other.

Figure 28:
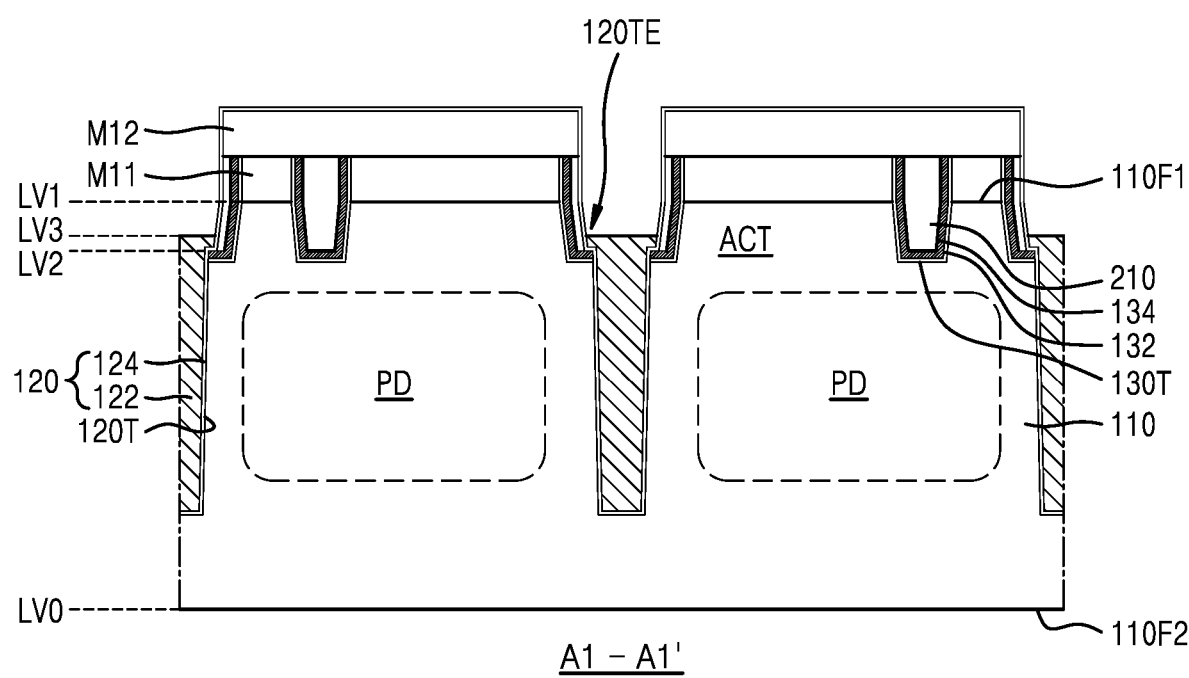

Referring to FIG. 28, the top portion of the conductive layer 122 may be removed by an etch back process and the like until the top surface of the conductive layer 122 reaches the third vertical level LV3 that is lower than the first surface 110F1 of the semiconductor substrate 110.

Figure 29:
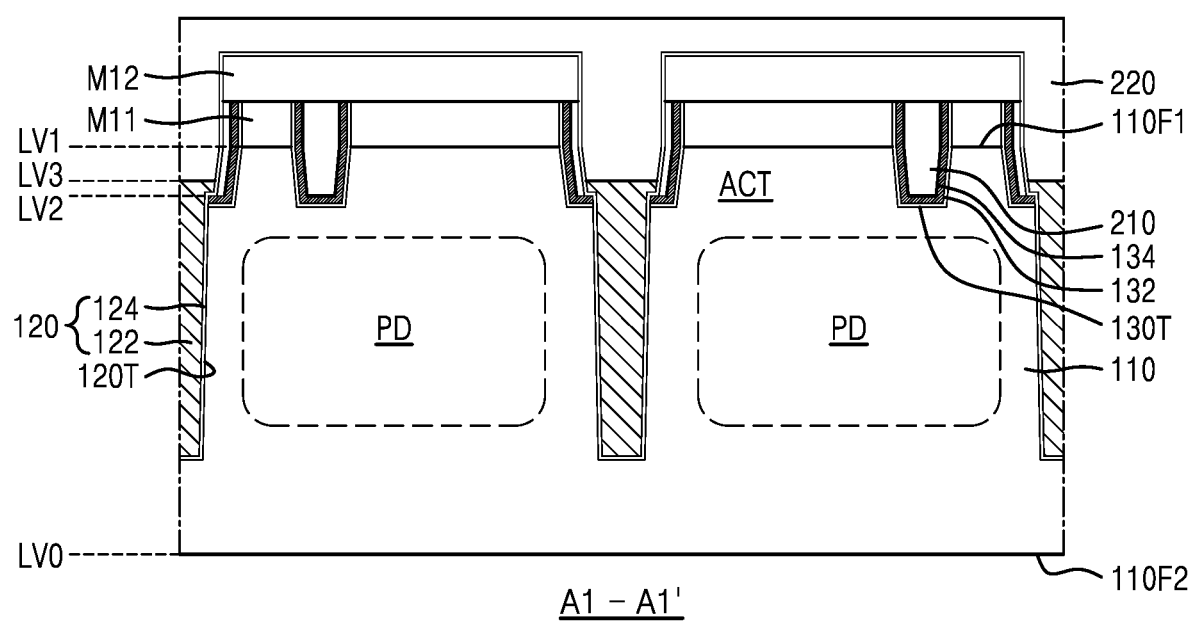

Referring to FIG. 29, top of the pixel trench 120T may be filled with a gap-fill insulating layer 220. The gap-fill insulating layer 220 may be formed by using, for example, silicon oxide, silicon nitride, or silicon oxynitride.

Figure 30:
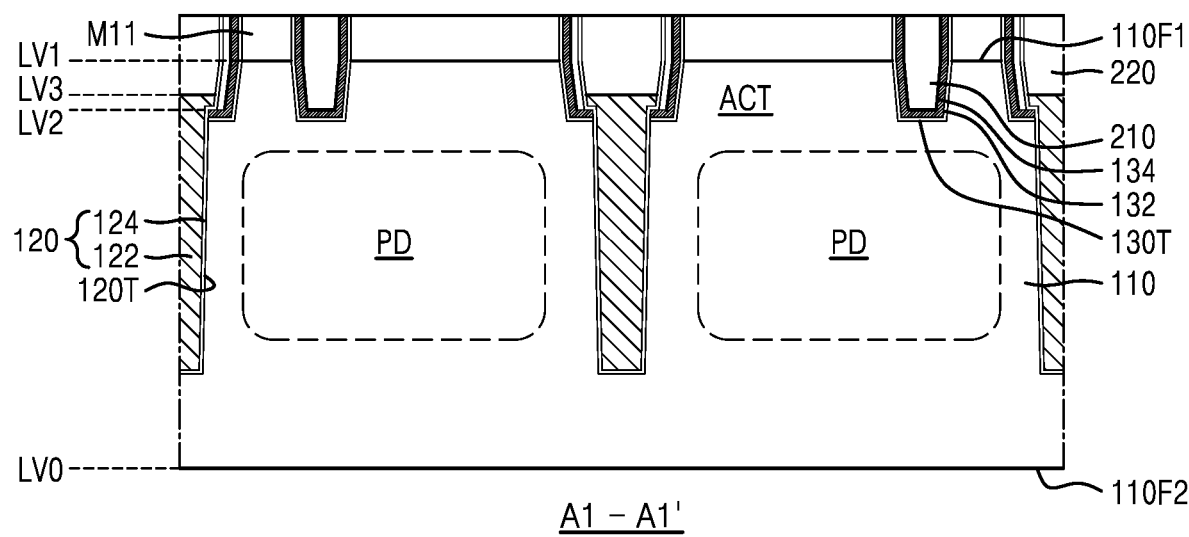

Referring to FIG. 30, the top surface of the first mask pattern M11 may be exposed by performing a planarizing process on the second mask pattern M12 and the gap-fill insulating layer 220. After performing the smoothening process, the top surface 134T (see, e.g., FIG. 6) of the conductive liner 134 of the device isolation structure 130 may be exposed.

Figure 31:
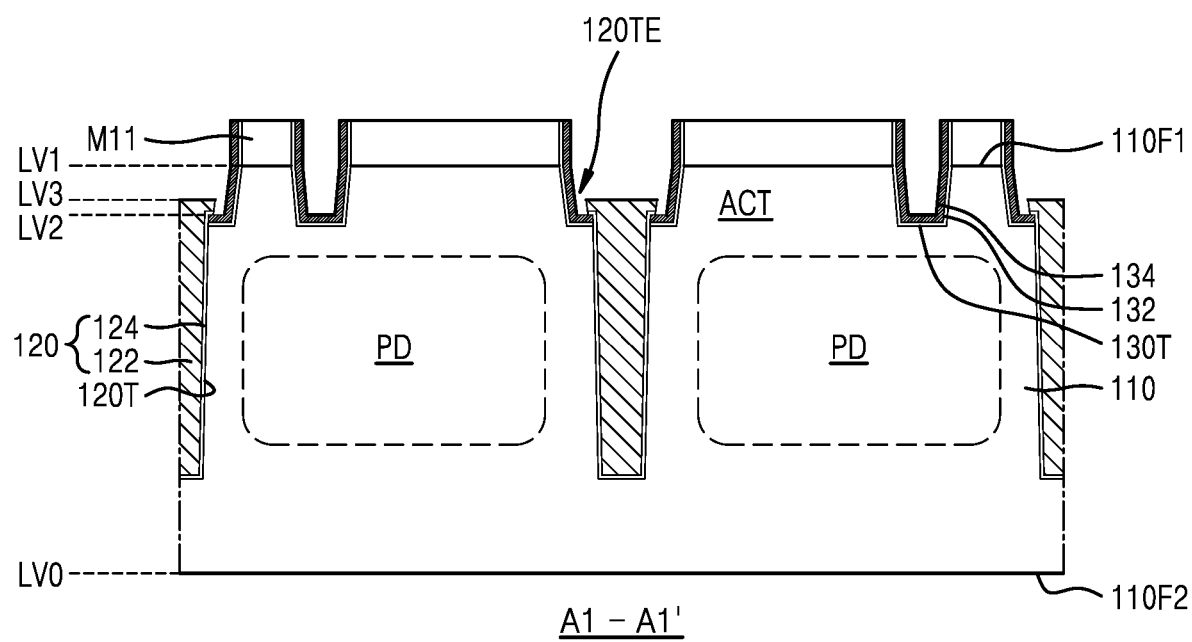

Referring to FIG. 31, the buried insulating layer 210, which is in the expanded top side 120TE of the pixel trench 120T and the device isolation trench 130T, and the gap-fill insulating layer 220, which is in the expanded top side 120TE of the pixel trench 120T, may be removed. For example, the removing process may include a wet etch process. In a process of removing the buried insulating layer 210 and the gap-fill insulating layer 220, a portion of the insulating layer 124 and a portion of the buried insulating layer 210, which are on the sidewall of the expanded top side 120TE of the pixel trench 120T, may be removed together, and the conductive liner 134 may be exposed.

Figure 32:
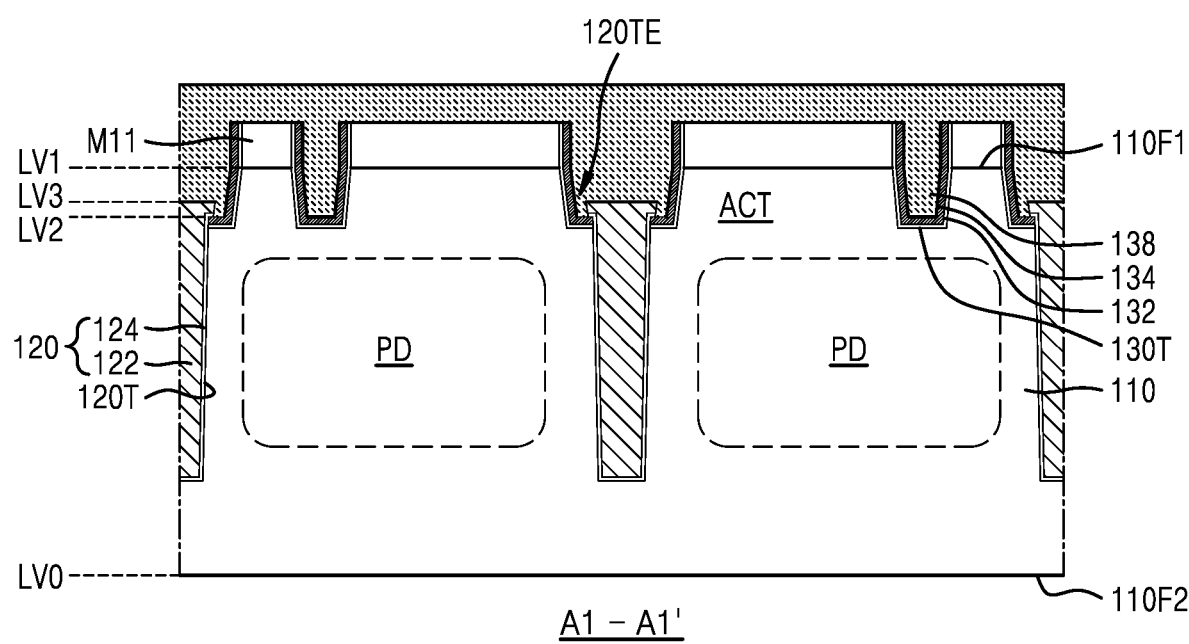

Referring to FIG. 32, the gap-fill conductive layer 138 may be formed in the expanded top side 120TE of the pixel trench 120T and the device isolation trench 130T. The gap-fill conductive layer 138 may be formed on both the conductive layer 122 and the conductive liner 134. For example, the gap-fill conductive layer 138 may directly contact both of the conductive layer 122 and the conductive liner 134.

Figure 33:
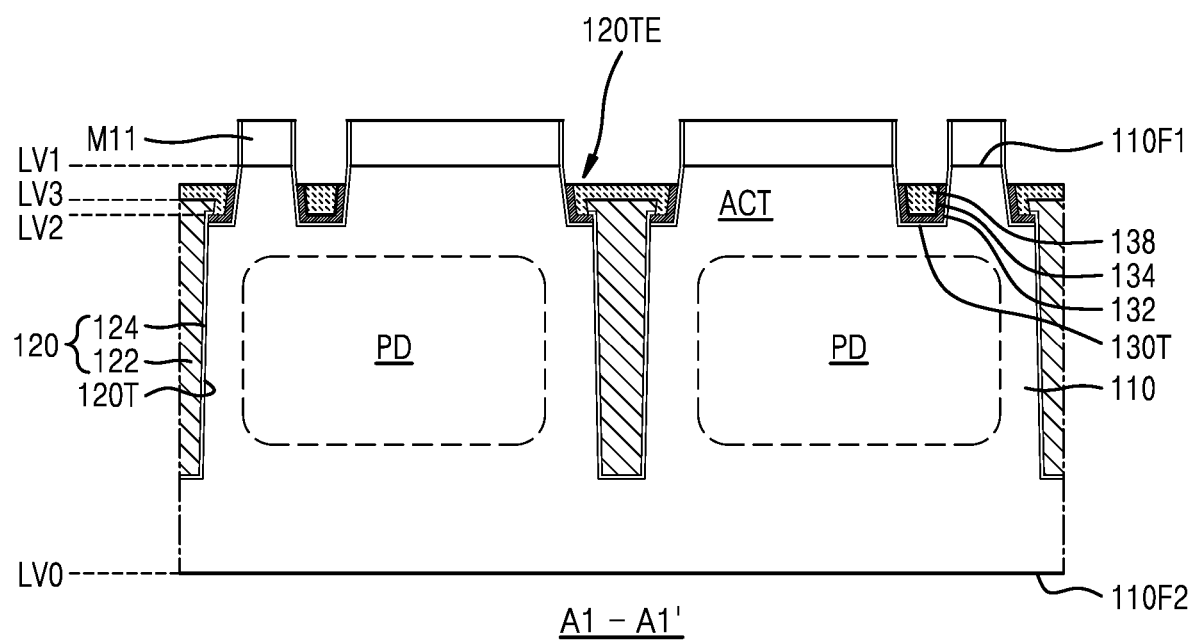

Referring to FIG. 33, a top portion of the gap-fill conductive layer 138 may be lowered, by an etch back process, to the fourth vertical level LV4 that is lower than the first surface 110F1 of the semiconductor substrate 110. For example, the gap-fill conductive layer 138 may have a substantially smooth or planar top surface level. In addition, the gap-fill conductive layer 138 may have a top surface that is coplanar with the top surface of the conductive liner 134.

Figure 34:
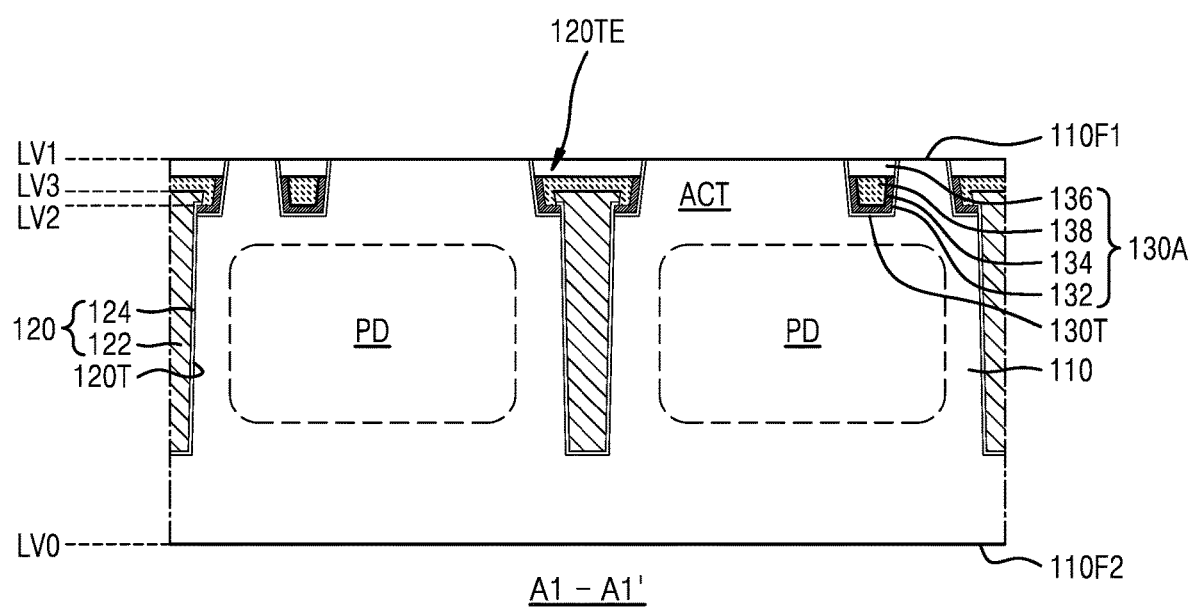

Referring to FIG. 34, an insulating layer filling the expanded top side 120TE of the pixel trench 120T and the device isolation trench 130T may be formed on the first surface 110F1 of the semiconductor substrate 100, and by planarizing a top surface of the insulating layer until the first surface 110F1 of the semiconductor substrate 110 is exposed, the buried insulating layer 136 may remain in the expanded top side 120TE of the pixel trench 120T and the device isolation trench 130T.

Thereafter, the image sensor 100A may be formed by performing the processes described above with reference to FIGS. 22 through 25.

Figure 35:
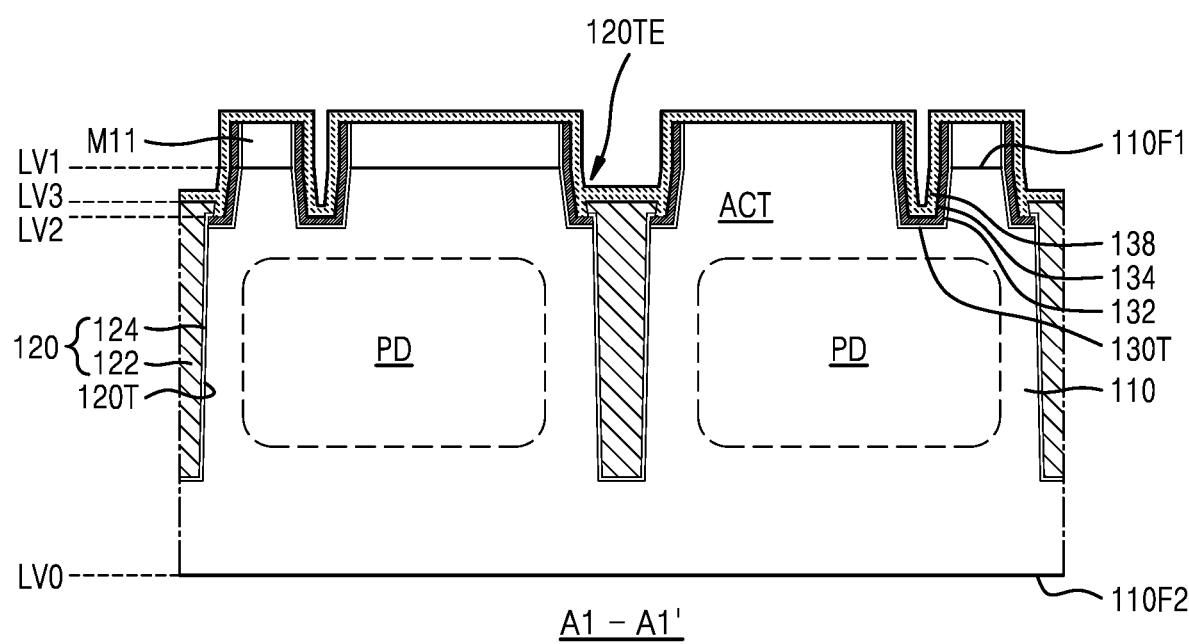
FIG. 35 is a cross-sectional view illustrating a method of manufacturing an image sensor according to an exemplary embodiment of the present inventive concept.

FIG. 35 is a cross-sectional view showing a method of manufacturing the image sensor 100B according to an exemplary embodiment of the present inventive concept.

Referring to FIG. 35, unlike the description with reference to FIG. 32, the gap-fill conductive layer 138 may not completely fill the device isolation trench 130T, and the gap-fill conductive layer 138 may be conformally formed on the sidewall of the device isolation trench 130T.

Thereafter, the gap-fill conductive layer 138 and the conductive liner 134 may remain in the device isolation trench 130T by etching a portion of the gap-fill conductive layer 138 and a portion of the conductive liner 134 on the device isolation trench 130T.

Thereafter, the image sensor 100B may be formed by performing the processes described with reference to FIGS. 22 through 25.

Figure 36:
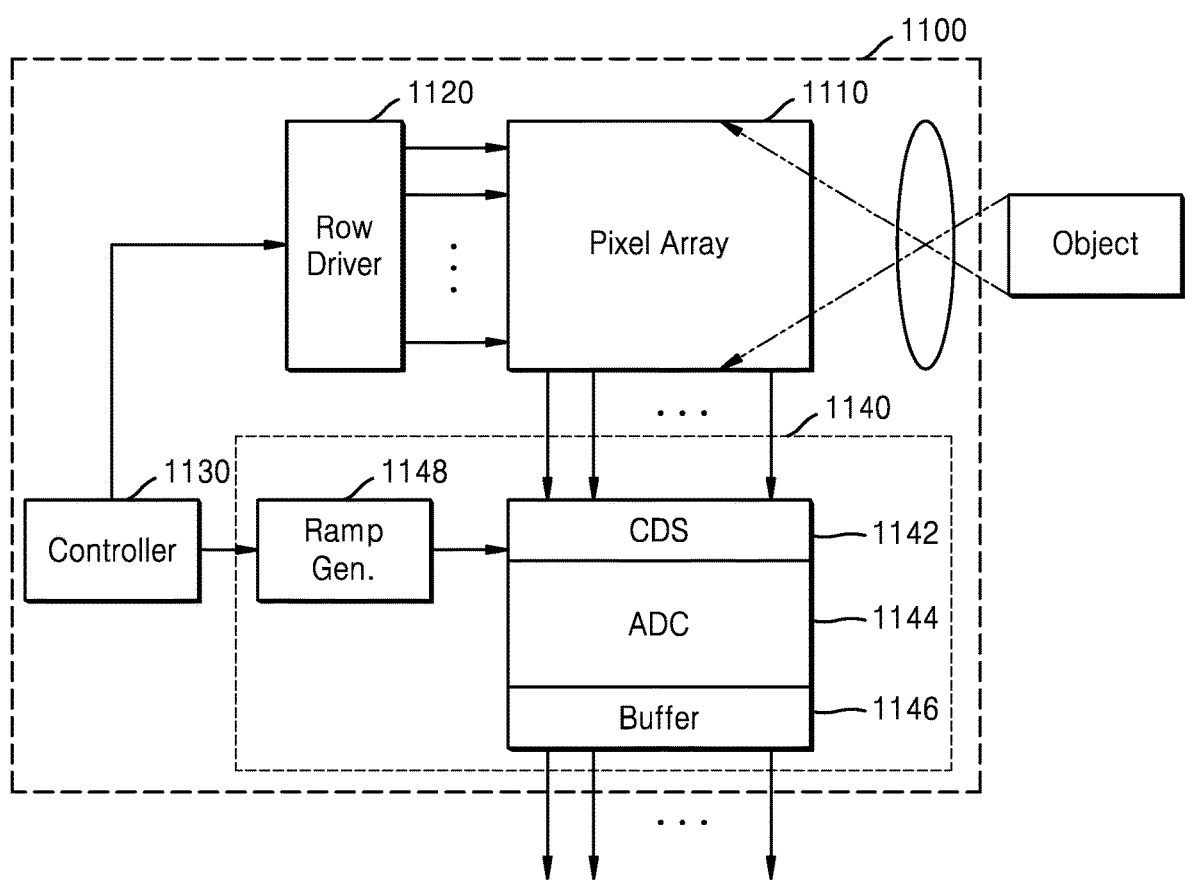
FIG. 36 is a block diagram of a configuration of an image sensor according to an exemplary embodiment of the present inventive concept.

FIG. 36 is a block diagram of a configuration of an image sensor 1100 according to an exemplary embodiment of the present inventive concept.

Referring to FIG. 36, the image sensor 1100 may include a pixel array 1110, a controller 1130, a row driver 1120, and a pixel signal processor 1140. The image sensor 1100 includes at least one of the image sensors 100, 100A, 100B, 100C, and 200 described above with reference to FIGS. 1 to 12.

The pixel array 1110 may include a plurality of unit pixels that are two-dimensionally arranged, and each of the plurality of unit pixels may include an organic photoelectric conversion device. The photoelectric conversion device absorbs light to generate a charge, and an electrical signal (e.g., an output voltage) according to the generated charge may be provided to the pixel signal processor 1140 through a vertical signal line. Unit pixels included in the pixel array 1110 may provide output voltages one by one in a row unit, and accordingly, the unit pixels in one row of the pixel array 1110 may be simultaneously activated by a selection signal output from the row driver 1120. The unit pixels in a selected row may provide output voltages, according to the absorbed light, to output lines of corresponding columns.

The controller 1130 may control the row driver 1120 to allow the pixel array 1110 to absorb light and accumulate charges, temporarily store the accumulated charges, or output electrical signals according to the stored charges to the outside of the pixel array 1110. In addition, the controller 1130 may control the pixel signal processor 1140 to measure the output voltages provided by the pixel array 1110.

The pixel signal processor 1140 may include a correlated double sampler (CDS) 1142, an analog-digital converter (ADC) 1144, and a buffer 1146. The CDS 1142 may sample and hold the output voltages provided by the pixel array 110. The CDS 1142 may perform double sampling on a certain noise level and a level according to the generated output voltage, and may output a level corresponding to a difference between the certain noise level and the level according to the generated output voltage. In addition, the CDS 1142 may receive ramp signals generated by a ramp signal generator 1148, compare the ramp signals, and output a result of the comparison.

The ACD 1144 may convert analog signals, which correspond to the levels received from the CDS 1142, to digital signals. The buffer 1146 may latch the digital signals, and the latched signals may be sequentially output to the outside (e.g., an external circuit or external device) of the image sensor and may be provided to an image processor.

While the present inventive concept has been described with reference to embodiments thereof, it will be understood by those of ordinary skill in the art that various changes in form and details may be made thereto without departing from the spirit and scope of the present inventive concept.

What is claimed is:

1. An image sensor comprising:
a semiconductor substrate having a first surface and a second surface;
a pixel device isolation film extending from the first surface of the semiconductor substrate into the semiconductor substrate, wherein the pixel device isolation film defines pixels in the semiconductor substrate, and comprises a conductive layer; and
a device isolation structure located inside a device isolation trench that extends from the first surface of the semiconductor substrate into the semiconductor substrate, wherein the device isolation structure comprises a conductive liner electrically connected to the conductive layer,
wherein a negative bias is applied to the conductive layer and the conductive liner.

2. The image sensor of claim 1, wherein the pixel device isolation film is located inside a pixel trench that penetrates the semiconductor substrate, and
the conductive liner is connected to the conductive layer in a region in which the device isolation trench and the pixel trench overlap each other.

3. The image sensor of claim 2, wherein the device isolation structure further comprises:
an insulating liner on an inner wall of the device isolation trench; and
a buried insulating layer filling the device isolation trench and disposed on the insulating liner,
wherein the conductive liner is interposed between the insulating liner and the buried insulating layer.

4. The image sensor of claim 3, wherein the conductive layer has a top surface at a higher level than that of a bottom surface of the device isolation trench.

5. The image sensor of claim 3, wherein the conductive layer comprises:
a pair of protrusion portions extending outwards with respect to sidewalls of the conductive layer, wherein the pair of protrusion portions are at a level higher than that of a bottom portion of the device isolation trench, and the pair of protrusion portions are at least partially surrounded by the buried insulating layer.

6. The image sensor of claim 5, wherein the pixel device isolation film further comprises:
a lower insulating layer arranged inside the pixel trench and covering the sidewalls of the conductive layer; and
an upper insulating layer arranged between the buried insulating layer and the pair of protrusion portions, wherein the upper insulating layer is spaced apart from the lower insulating layer.

7. The image sensor of claim 2, wherein the device isolation structure comprises:
an insulating liner arranged on an inner wall of the device isolation trench and between the semiconductor substrate and the conductive liner,
a gap-fill conductive layer arranged between the conductive liner and the conductive layer; and
a buried insulating layer filling the device isolation trench and disposed on the conductive liner and the gap-fill conductive layer.

8. The image sensor of claim 7, wherein the conductive layer comprises:
a pair of protrusion portions at a level higher than that of a bottom portion of the device isolation trench, and
the gap-fill conductive layer overlaps a top surface of the conductive layer and the pair of protrusion portions.

9. The image sensor of claim 7, wherein the conductive liner and the gap-fill conductive layer each has a top surface at a level lower than that of the first surface of the semiconductor substrate.

10. The image sensor of claim 1, wherein the conductive liner has a thickness from about 5 nm to about 30 nm.

11. The image sensor of claim 1, further comprising a backside contact structure located inside a backside contact hole that is formed in the second surface of the semiconductor substrate, wherein the backside contact structure is connected to the conductive layer of the pixel device isolation film.

12. An image sensor comprising:
a semiconductor substrate having a first surface and a second surface;
a pixel device isolation film located inside a pixel trench that penetrates the semiconductor substrate, wherein the pixel device isolation trench comprises a conductive layer; and
a device isolation structure located inside a device isolation trench that extends from the first surface of the semiconductor substrate, wherein the device isolation structure defines an active region,
wherein the device isolation structure comprises:
an insulating liner on an inner wall of the device isolation trench;
a conductive liner on the insulating liner and covering the inner wall of the device isolation trench; and
a buried insulating layer filling the device isolation trench and disposed on the conductive liner,
wherein, in a region in which the device isolation structure and the pixel device isolation film vertically overlap each other, the conductive liner is electrically connected to the conductive layer.

13. The image sensor of claim 12, wherein the conductive layer comprises:
a pair of protrusion portions extending outwards with respect to sidewalls of the conductive layer, wherein the pair of protrusion portions are at a level higher than that of a bottom portion of the device isolation trench, and the conductive layer has a top surface at a higher level than that of a bottom surface of the device isolation trench.

14. The image sensor of claim 13, wherein the pixel device isolation film further comprises:
a lower insulating layer arranged inside the pixel trench and covering the sidewalls of the conductive layer; and
an upper insulating layer arranged between the buried insulating layer and the pair of protrusion portions, wherein the upper insulating layer is spaced apart from the lower insulating layer,
wherein the pair of protrusion portions are at least partially surrounded by the buried insulating layer and the upper insulating layer.

15. The image sensor of claim 13, wherein the device isolation structure further comprises:
a gap-fill conductive layer arranged between the conductive liner and the pair of protrusion portions, and
the gap-fill conductive layer overlaps a top surface of the conductive layer and the pair of protrusion portions.

16. The image sensor of claim 15, wherein the conductive liner and the gap-fill conductive layer each has a top surface at a level lower than that of the first surface of the semiconductor substrate.

17. An image sensor comprising:
a semiconductor substrate having a first surface and a second surface;
a pixel device isolation film located inside a pixel trench that penetrates the semiconductor substrate, wherein the pixel device isolation film includes a conductive layer; and
a device isolation structure located inside a device isolation trench that extends from the first surface of the semiconductor substrate into the semiconductor substrate, wherein the device isolation structure defines an active region, wherein the device isolation structure further comprises:
an insulating liner on an inner wall of the device isolation trench;
a conductive liner covering the inner wall of the device isolation trench and disposed on the insulating liner; and
a buried insulating layer filling the device isolation trench and disposed on the conductive liner,
wherein a negative bias is applied to the conductive liner.

18. The image sensor of claim 17, wherein the conductive layer comprises:
a pair of protrusion portions extending outwards with respect to sidewalls of the conductive layer, wherein the pair of protrusion portions are at a level higher than that of a bottom portion of the device isolation trench, and
the conductive layer has a top surface at a higher level than that of a bottom surface of the device isolation trench.

19. The image sensor of claim 18, wherein the pixel device isolation film further comprises:
a lower insulating layer arranged inside the pixel trench and covering the sidewalls of the conductive layer; and
an upper insulating layer arranged between the buried insulating layer and the pair of protrusion portions, wherein the upper insulating layer is spaced apart from the lower insulating layer,
wherein the pair of protrusion portions are at least partially surrounded by the buried insulating layer and the upper insulating layer.

20. The image sensor of claim 18, further comprising a backside contact structure located inside a backside contact hole formed in the second surface of the semiconductor substrate, wherein the backside contact structure is connected to the conductive layer of the pixel device isolation film.

* * * * *